(12) United States Patent
Fukuhara et al.

(10) Patent No.: US 7,556,896 B2
(45) Date of Patent: Jul. 7, 2009

(54) INSPECTION METHOD AND PHOTOMASK

(75) Inventors: Kazuya Fukuhara, Tokyo (JP); Satoshi Tanaka, Kanagawa (JP); Soichi Inoue, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 174 days.

(21) Appl. No.: 11/606,121

(22) Filed: Nov. 30, 2006

(65) Prior Publication Data

US 2007/0071306 A1 Mar. 29, 2007

Related U.S. Application Data

(62) Division of application No. 10/615,228, filed on Jul. 9, 2003, now Pat. No. 7,186,485.

(30) Foreign Application Priority Data

Jul. 11, 2002 (JP) ............................ P2002-203194

(51) Int. Cl.
*G03F 9/00* (2006.01)
(52) U.S. Cl. ............................ 430/5; 430/30; 382/145
(58) Field of Classification Search .................... 430/5, 430/30; 382/145
See application file for complete search history.

(56) References Cited

U.S. PATENT DOCUMENTS 5,245,470 A 9/1993 Keum
5,541,026 A 7/1996 Matsumoto
5,933,219 A 8/1999 Unno
6,130,747 A 10/2000 Nomura et al.
2002/0086224 A1 7/2002 Kanda

FOREIGN PATENT DOCUMENTS

JP 6-181167 6/1994
JP 11-237310 8/1999
JP 3256678 B2 2/2002

OTHER PUBLICATIONS

Search Report issued by the Netherlands Patent Office on Jul. 26, 2005, for Netherlands Application No. 135218.
Nomura, "Investigation of High-Precision Lithography lens Aberration Measurement Based on Three-Beam Interference Theory: Sensitivity versus Coherent Factor and Variations with Dose and Focus," Optical Review (Jul. 2000), 7:525-534.

*Primary Examiner*—Christopher G Young
(74) *Attorney, Agent, or Firm*—Finnegan, Henderson, Farabow, Garrett & Dunner, L.L.P.

(57) ABSTRACT

An inspection method, includes obtaining a first optical characteristic of a projection optical system by transferring an image of an aberration measurement unit of a photomask on a first resist film coated on a first wafer by use of a first polarized exposure light; obtaining a second optical characteristic of the projection optical system by transferring the image of the aberration measurement unit on a second resist film coated on a second wafer by use of a second exposure light having a polarization state different from the first exposure light; and calculating a difference between the first and second optical characteristics.

18 Claims, 17 Drawing Sheets

FIG.10A
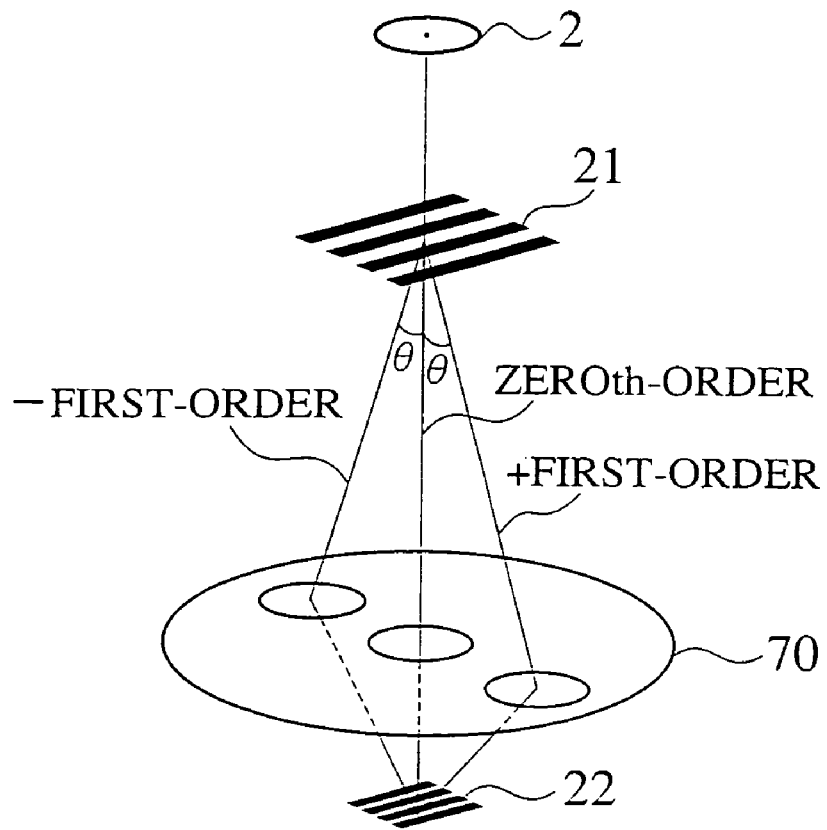
FIG.10B     FIG.10C
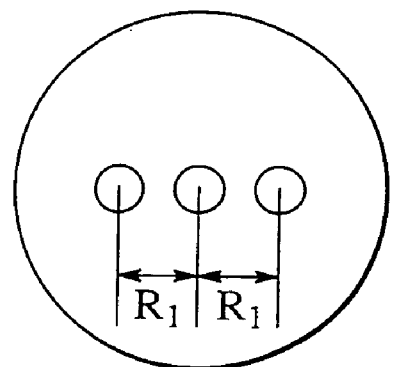
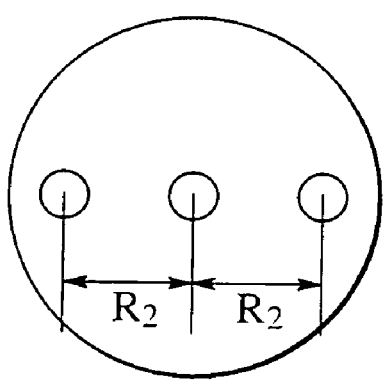

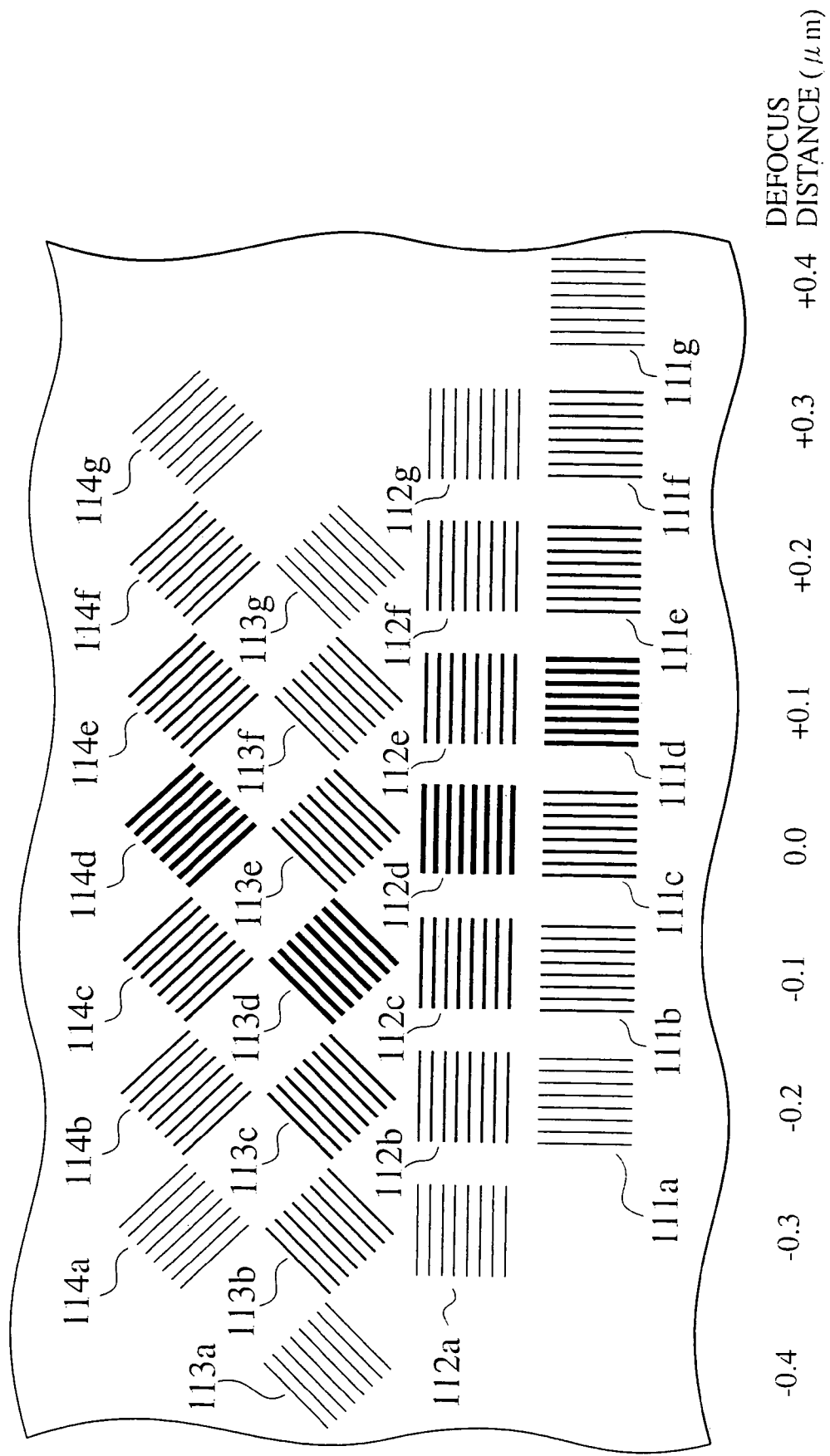

|  | TEST 1 | TEST 2 | DIFFERENCE |
|---|---|---|---|
| ASTIGMATISM a5 | 10.9 | 6.0 | 4.8 |
| ASTIGMATISM a6 | 6.7 | 15.8 | -9.1 |
| COMA a7 | 4.2 | -2.2 | 6.4 |
| COMA a8 | 0.5 | -7.3 | 7.8 |
| SPHERICAL ABERRATION a9 | 8.5 | -2.4 | 10.9 |
| 3θ ABERRATION a10 | 0.0 | 12.0 | -12.0 |
| 3θ ABERRATION a11 | 6.5 | 0.1 | 6.4 |

UNIT : mλ

INSPECTION METHOD AND PHOTOMASK

This is a division of application Ser. No. 10/615,228, filed Jul. 9, 2003, now U.S. Pat. No. 7,186,485 which is incorporated herein by reference.

CROSS REFERENCE TO RELATED APPLICATIONS

This application is based upon and claims the benefit of priority from prior Japanese Patent Application P2002-203194 filed on Jul. 11, 2002; the entire contents of which are incorporated by reference herein.

BACKGROUND OF THE INVENTION

1. Field of the Invention

The present invention relates to photolithography technology, more particularly to an inspection method for performance of a projection optical system of an exposure apparatus and to a photomask used for the inspection.

2. Description of the Related Art

A minimum line width and a minimum period of a pattern constructing a semiconductor device have decreased year by year. A minimum resolution line width required for an exposure apparatus resolving the pattern of the semiconductor device is currently about 100 nm or less. A minimum resolution period of the exposure apparatus is determined by an exposure wavelength $\lambda$ and a numerical aperture (NA) of a projection lens. In order to form a finer pattern, it is satisfactory that the exposure wavelength $\lambda$ is shortened and the NA is increased. Thus, shortening of a wavelength of exposure light has been achieved. An argon fluoride (ArF) excimer laser exposure apparatus ($\lambda$=193 nm) has been put into practical use in recent years. In addition, development of a fluorine gas ($F_2$) excimer laser exposure apparatus ($\lambda$=157 nm) has been underway aiming for practical use in a few years. The types of optical materials usable as a photolithography lens with a wavelength of 193 nm or less are limited. In the current technology, fluorite (calcium fluoride single crystal) and fused quartz can be used for light with a wavelength of 193 nm. However, for light with a wavelength of 157 nm, only fluorite is usable.

One of the phenomena emerging as a problem in using a lens is birefringence. A refractive index is a physical quantity controlling a refraction angle and a phase velocity of light. Thus, when a projection lens shows birefringence, imaging characteristics of the projection lens are changed depending on polarization states of light. When birefringence exists in the lens, an image becomes out of focus due to, for example, formation of images at different positions for every polarization state of exposure light, and image contrast and resolution performance are decreased. Thus, there is a possibility that a fine pattern cannot be formed.

It has been revealed from recent research that fluorite has a relatively large birefringence in a specific crystallographic axis direction. Even if a lens is manufactured by taking a crystallographic axis in fluorite, as an optical axis direction, which axis shows no birefringence, the lens shows birefringence as to optical paths along directions not parallel to the optical axis. As a result, the finer the pattern to be transferred, the more diffracted light is generated in the direction not parallel to the optical direction. Therefore, the more likely the lens will be influenced by the birefringence. In order to suppress the influence of the birefringence in the lens as a whole, a plurality of fluoric lenses are disposed by alternating respective crystallographic axis directions thereof. Thus, the influence of the birefringence can be offset to some extent or can be prevented from being focused on a specific optical path. However, even in the above case, the current technology has difficulties in completely suppressing the influence of the birefringence.

The birefringence of lens materials used in the projection optical system of the exposure apparatus deteriorates imaging performance. Therefore, the birefringence has to be suppressed. However, merely observing the deteriorated state of the image does not enable determination of whether or not the deterioration is caused by the birefringence. As the patterns of the semiconductor device become fine, it is necessary to use a lens with small birefringence in the projection optical system. Moreover, a method for inspecting whether or not birefringence is suppressed as much as possible, apart from other factors of image deterioration, is necessary.

SUMMARY OF THE INVENTION

A first aspect of the present invention inheres in an inspection method, and includes: obtaining a first optical characteristic of a projection optical system by transferring an image of an aberration measurement unit of a photomask on a first resist film coated on a first wafer by use of a first polarized exposure light; obtaining a second optical characteristic of the projection optical system by transferring the image of the aberration measurement unit on a second resist film coated on a second wafer by use of a second exposure light having a polarization state different from the first exposure light; and calculating a difference between the first and second optical characteristics.

A second aspect of the present invention inheres in a photomask, and includes: a transparent substrate having a first surface and a second surface opposite to the first surface; an aberration measurement unit disposed on the first surface; and a polarizer disposed so as to be opposite to the aberration measurement unit on the second surface.

A third aspect of the present invention inheres in a photomask, and includes: a transparent substrate having a first surface; an aberration measurement unit disposed on the first surface; a pellicle provided as a second transparent substrate having a second surface, the pellicle disposed opposite to the first surface; and a polarizer disposed so as to be opposite to the aberration measurement unit on the second surface.

BRIEF DESCRIPTION OF DRAWINGS

FIGS. 10A through 10C are views explaining diffraction light passing through a pupil plane according to the embodiment of the present invention;

FIG. 11 is a view explaining resist patterns for even function aberration measurement according to the embodiment of the present invention;

DETAILED DESCRIPTION OF THE INVENTION

Figure 1:
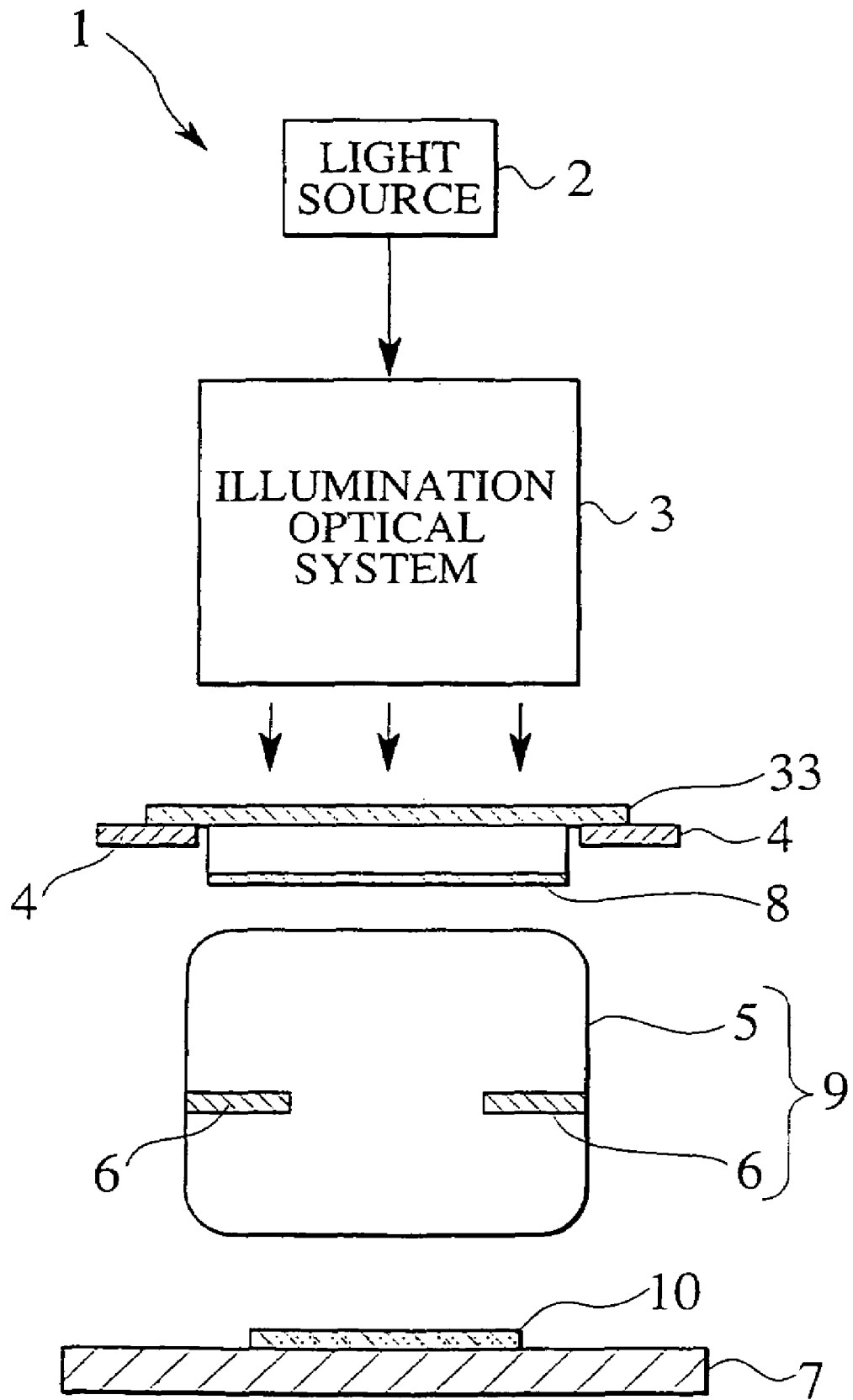
FIG. 1 is a schematic constitutional view of an exposure apparatus according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

An exposure apparatus 1 used for explaining an inspection method of a projection optical system of an embodiment of the present invention is a refractive exposure apparatus (scanner) as shown in FIG. 1, in which a reduction ratio is set at 1:4. As a light source 2, an argon fluoride (ArF) excimer laser with a wavelength λ of 193 nm is used. Included in an illumination optical system 3, are a fly's eye lens, a condenser lens and the like. A projection optical system 9 is composed of a projection lens 5, an aperture stop 6 and the like. Exposure light projects, on a wafer 10 on a substrate stage 7, a pattern of a photomask 33 provided on a mask stage 4 between the illumination optical system 3 and the projection optical system 9. A pellicle 8 is provided for preventing adhesion of dust on the photomask 33 and is composed of a transparent substrate such as the same material as that of the photomask 33. Note that, as a matter of explanatory convenience, the scanner is shown as the exposure apparatus 1. However, besides the scanner, a stepper and the like may be usable. Moreover, although the reduction ratio is set at 1:4, it is needless to say that any reduction ratio may be adopted.

Figure 2A:
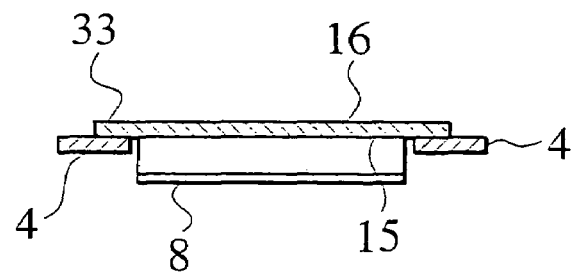
FIGS. 2A through 2C are views explaining an example of a configuration of a photomask according to the embodiment of the present invention.
Figure 2B:
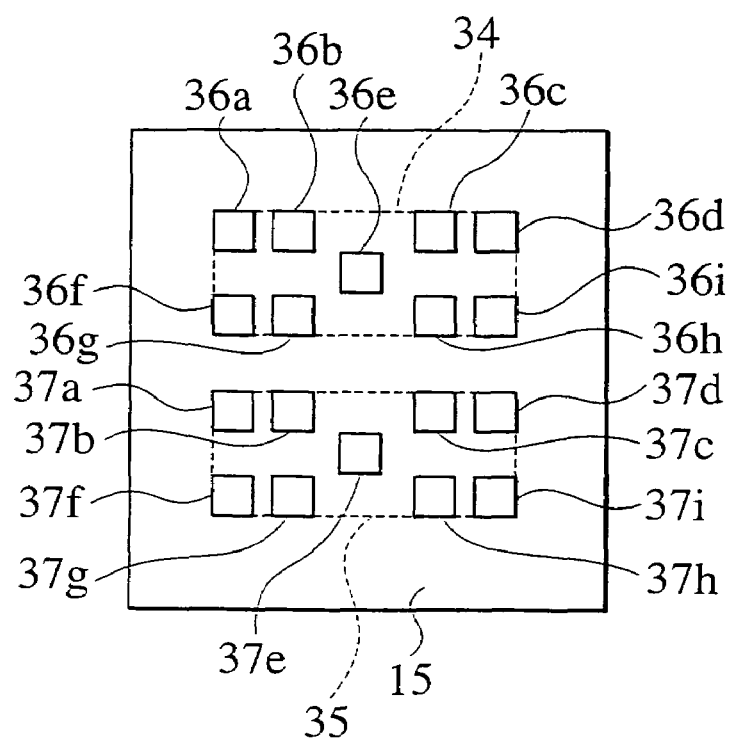
Figure 2C:
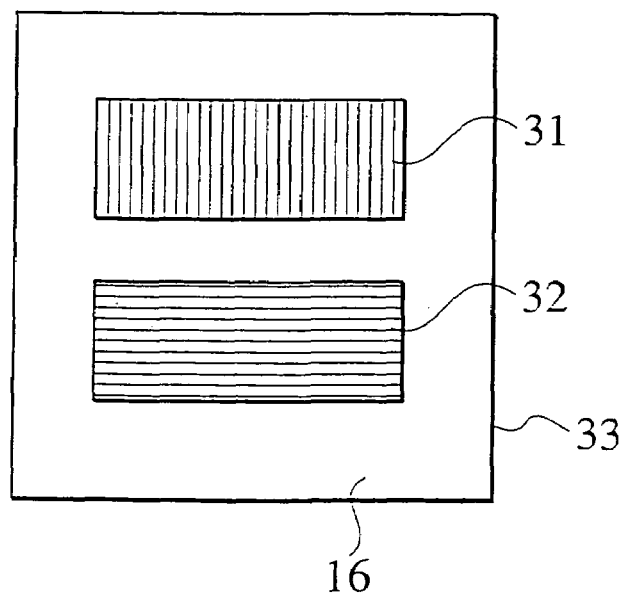

As shown in FIG. 2A, the photomask 33 according to the embodiment of the present invention is provided on the mask stage 4 of the exposure apparatus 1, the photomask having a first surface 15 facing downward, which is protected by the pellicle 8. On the first surface 15 of the photomask 33, as shown in FIG. 2B, aberration measurement units 36a to 36i and 37a to 37i are disposed in a first aberration measurement unit region 34 and a second aberration measurement unit region 35, respectively. Specifically, the aberration measurement units measure, as optical characteristics of the projection optical system 9, various lens aberrations including, for example: odd function aberrations such as a coma aberration, a 3θ aberration and the like; and even function aberrations such as a spherical aberration, astigmatism and the like. On a second surface 16 of the photomask 33, as shown in FIG. 2C, two types of wire grid polarizers are disposed. Period directions of wire grid patterns of a first polarizer 31 and a second polarizer 32 are orthogonal to each other. The first polarizer is placed opposite to the first aberration measurement unit region 34 and the second polarizer is placed opposite to the second aberration measurement unit region 35. For example, the period direction of the wire grid pattern of the first polarizer 31 is parallel to the left and right sides of the photomask 33 shown in FIG. 2C, and the period direction of the wire grid pattern of the second polarizer 32 is orthogonal to the period direction of the wire grid pattern of the first polarizer 31.

Figure 3A:
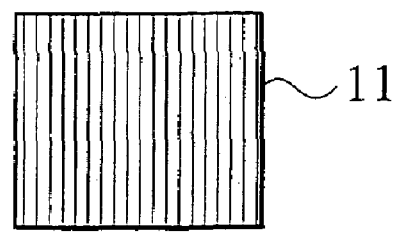
FIGS. 3A and 3B are views explaining one example of a structure of a wire grid polarizer according to the embodiment of the present invention.
Figure 3B:
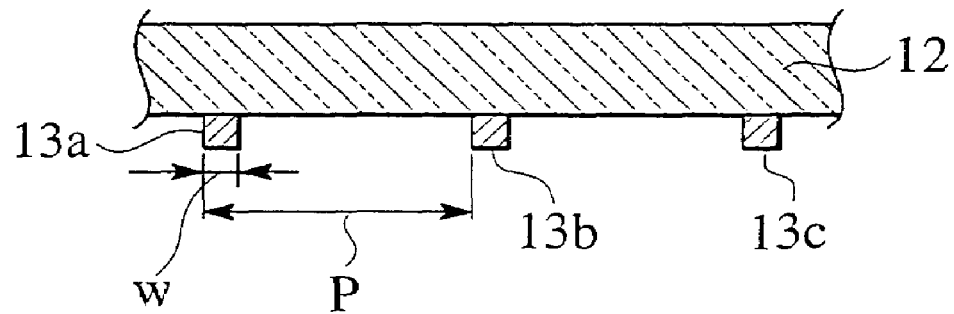

The wire grid polarizer 11 disposed on the second surface 16 of the photomask 33 according to the embodiment of the present invention is, as shown in a plan view of FIG. 3A, a line and space (L/S) pattern having periodicity in a predetermined direction. In a cross-sectional structure in a period direction of the L/S pattern of the wire grid polarizer 11, as shown in FIG. 3B, opaque portions 13a to 13c of a metal film such as chrome (Cr) are arranged, on a transparent substrate 12 made of transparent quartz, for example, with a fixed opaque portion width w of 20 nm and at a fixed period P of 100 nm. The wire grid polarizer 11 has a function of passing linearly polarized light out of incident light, the linearly polarized light having a vibration plane of an electric field in the period P direction of the L/S pattern.

The photomask 33 according to the embodiment of the present invention is provided on the mask stage 4 of the exposure apparatus. 1, facing the second surface 16 to the entrance side of the exposure light. Here, respective sizes of the first and second aberration measurement unit regions 34 and 35 are designed so as to coincide with that of a one-shot exposure region of the exposure apparatus 1. The exposure light entering the photomask 33 is first converted into linearly polarized light beams, in which the polarization planes are orthogonal to each other, by the first and second polarizers 31, 32. Then the polarized light beams enter the first aberration measurement unit regions 34 or the second aberration measurement unit regions 35. Since aberration measurements are performed using patterns exposed by use of the two types of the linearly polarized light beams, it is possible to determine the magnitude of birefringence of the projection lens 5 in the projection optical system 9. Note that, in the embodiment of the present invention, the second surface. 16 having the first and second polarizers 31, 32 faces to the entrance side of the exposure light. However, the second surface 16 may be provided so as to face to the exit side of the exposure light. When passing through the aberration measurement units 36a to 36i and 37a to 37i of the photomask 33, polarization states of the exposure light are not changed, and only respective linearly polarized light components thereof are selectively retrieved by the first and second polarizers 31, 32.

Figure 4A:
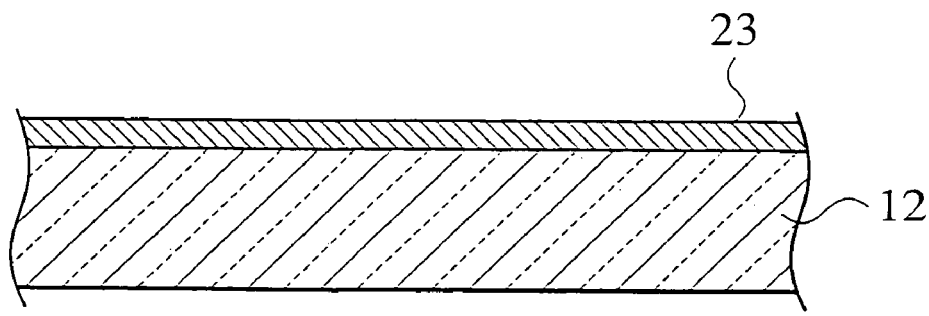
FIGS. 4A through 4C are views showing steps of manufacturing the wire grid polarizer according to the embodiment of the present invention.
Figure 4B:
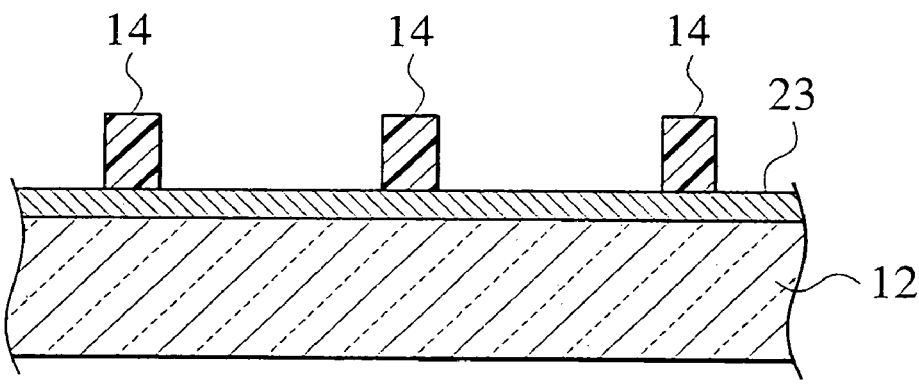
Figure 4C:
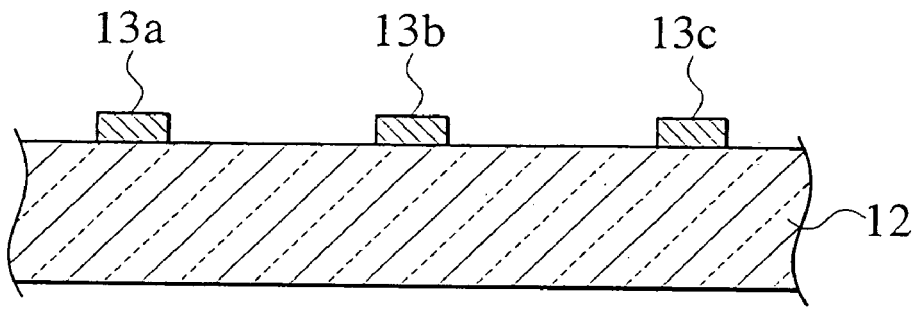

A method for forming the wire grid polarizer 11 is similar to a method for fabricating a photomask, which is used for manufacturing a semiconductor device. First, as shown in FIG. 4A, on the transparent substrate 12 approximately transparent to the exposure light, an opaque film 23 such as Cr, is deposited. Next, a resist film is applied on the surface of the opaque film 23 and a wire grid pattern is delineated thereon by use of an electron beam lithography apparatus. In a development process, as shown in. FIG. 4B, resist patterns 14 are formed on the opaque film 23. Thereafter, the opaque film 23 is selectively etched in a reactive ion etching (RIE) process and the like, and as shown in FIG. 4C, the opaque portions 13a to 13c are formed on the transparent substrate 12. Thus, the wire grid polarizer 11 is fabricated. Moreover, as described later, each of the aberration measurement marks used for measuring aberrations according to the embodiment of the present invention is also a L/S pattern, the basic structure of which has a predetermined period P. Thus, the marks are fabricated by use of a method similar to the method for fabricating the wire grid polarizer 11, which is shown in FIGS. 4A to 4C.

In the photomask 33 according to the embodiment of the present invention, on the first surface 15 thereof, the aberration measurement units 36a to 36i and 37a to 37i including the aberration measurement marks measuring various aberrations of the projection optical system 9 are formed in the first and second aberration measurement unit regions 34 and 35, respectively. Furthermore, on the second surface 16 thereof, the first and second polarizers 31, 32 are formed so as to be opposite to the first and second aberration measurement unit regions 34 and 35, respectively, the first and second polarizers 31, 32 having the wire grid patterns orthogonal to each other. Thus, the photomask is fabricated.

In the aberration measurements according to the embodiment of the present invention, for example, marks for measuring lens aberrations are used, which are described by the inventors of the present invention in Japanese Patent Publication No. 3256678. The aberration measurement marks include L/S patterns having a predetermined period P. A line width/period ratio of all the L/S patterns is 0.5. The period P satisfies the following relationship among coherence factor σ, exposure wavelength λ and projection lens numerical aperture NA of the exposure apparatus, $$3*\lambda/(NA*(1+\sigma))\geq P\geq \lambda/(NA*(1-\sigma)). \quad (1)$$

The condition of inequality (1) is a condition in which an image of the L/S pattern is formed by interference of a zeroth-order diffracted light and ± first-order diffracted lights, the condition being called the "three-beam interference condition." To be specific, the condition means a condition in which the first-order diffracted light pass through a pupil plane provided as an opening of the aperture stop 6 of the projection optical system 9 and high-order diffracted lights of a third-order or higher does not pass through the pupil plane of the aperture stop 6. Moreover, the line width/period ratio of the L/S pattern is set to 0.5, and thus a second-order diffracted light is not generated. In an aberration measurement under the three-beam interference condition, the sum and difference between a wavefront error in a path of + first-order diffracted light and a wavefront error in a path of − first-order diffracted light are measured.

Figure 5A:
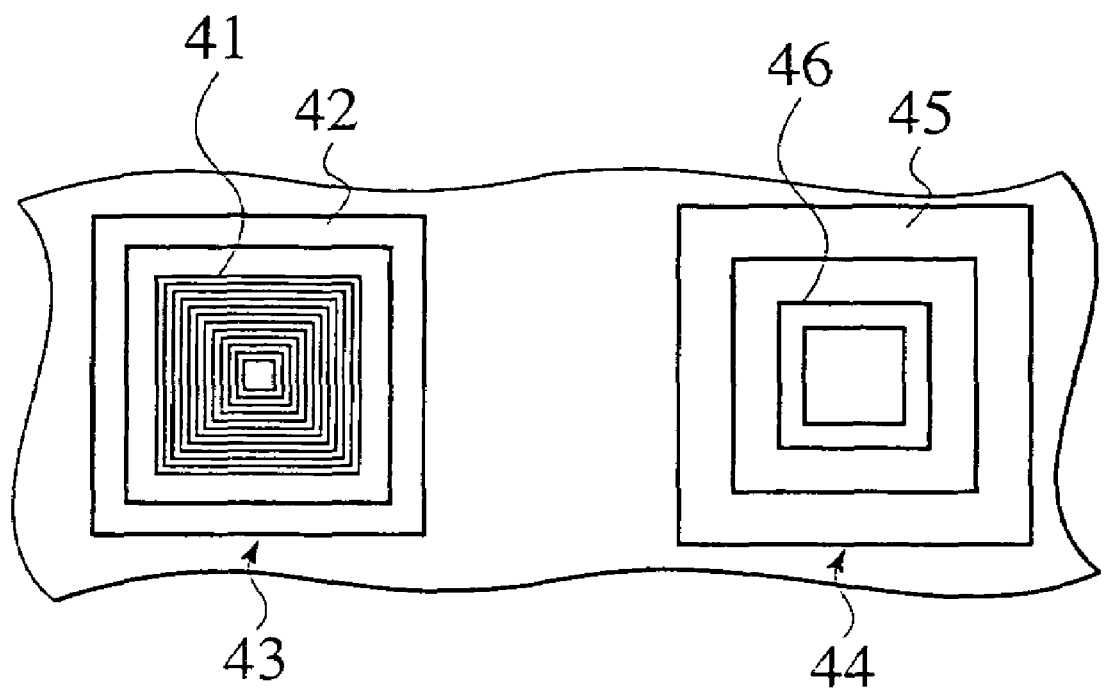
FIGS. 5A and 5B are views showing patterns of exposure marks for aberration measurement according to the embodiment of the present invention.

As shown in FIG. 5A, a basic configuration of the aberration measurement marks for measuring the odd function aberrations such as the coma aberration, the 3θ aberration and the like is composed of a pair of an exposure mark 43 and a trimming exposure mark 44, both of which are a plurality of square patterns. The exposure mark 43 has a L/S inner frame pattern 41, which is composed of fine L/S patterns of a uniform period, and an outer frame pattern 42 of a line having a width of 2 μm on the photomask, which is formed so as to surround the L/S inner frame pattern 41. In the fine L/S pattern of the L/S inner frame pattern 41, the period P satisfies the condition of the inequality (1). The trimming exposure mark 44 has an inner trimming pattern 46 and an outer trimming pattern 45. A distance between the centers of the exposure mark 43 and the trimming exposure mark 44 is 50 μm and both marks are disposed without overlapping with each other. The exposure mark 43 and the trimming exposure mark 44 are designed in such a manner that, for example, when the centers thereof are overlaid with each other by shifting one of the marks by 50 μm on the photomask in the lateral direction of FIG. 5A, the inner trimming pattern 46 overlaps a part of the L/S inner frame pattern 41 and the outer trimming pattern 45 completely covers the outer frame pattern 42.

Figure 6:
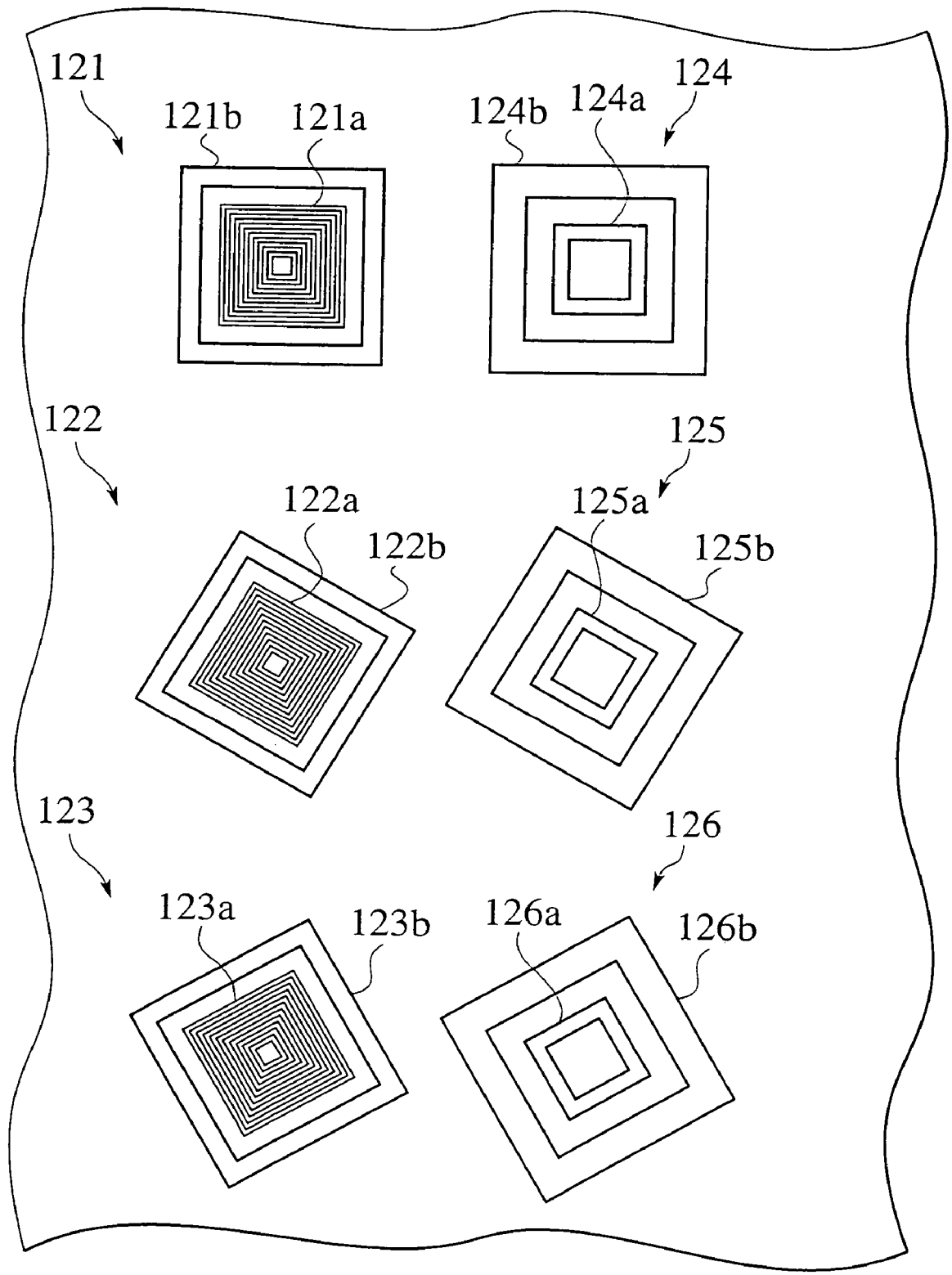
FIG. 6 is a view showing patterns of exposure marks for odd function aberration measurement according to the embodiment of the present invention.

As shown in FIG. 6, in the measurement of the odd function aberrations, similarly to the exposure mark 43 and the trimming exposure mark 44 of the basic structure shown in FIG. 5A, there are three pairs of exposure marks, which include: a pair comprising an exposure mark 121 and a trimming exposure mark 124; a pair comprising a first rotated exposure mark 122 and a first rotated trimming exposure mark 125, which are rotated clockwise by 30 degrees; and further a pair comprising a second rotated exposure mark 123 and a second rotated trimming exposure mark 126, which are rotated clockwise by 60 degrees. In the exposure marks 121 and the trimming exposure mark 124, a L/S inner frame pattern 121a, an outer pattern 121b, an inner trimming pattern 124a, and an outer trimming pattern 124b are disposed, respectively. Similarly, in the first and second rotated exposure marks 122 and 123, L/S inner frame patterns 122a, 123a and outer frame patterns 122b, 123b are disposed, respectively. In the first and second rotated trimming exposure marks 125 and 126, inner trimming patterns 125a, 126a and outer trimming patterns 125b, 126b are disposed, respectively.

Figure 7:
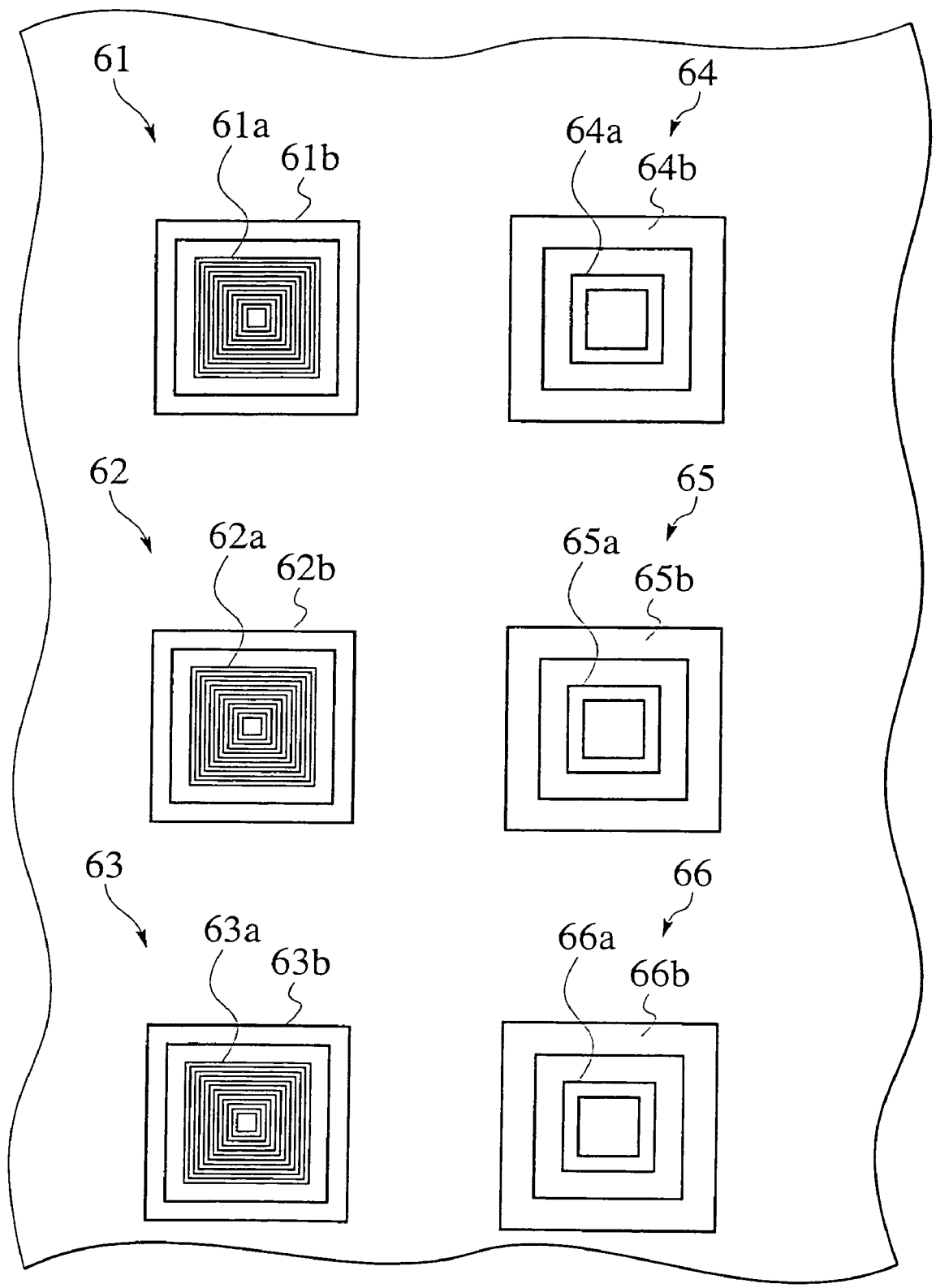
FIG. 7 is a view showing other patterns of the exposure marks for odd function aberration measurement according to the embodiment of the present invention.

Moreover, as shown in FIG. 7, a pair comprising a first exposure mark 61 and a first trimming exposure mark 64, a pair comprising a second exposure mark 62 and a second trimming exposure mark 65 and a pair comprising a third exposure mark 63 and a third trimming exposure mark 66 are used for the measurement of the odd function aberrations. Here, outer frame patterns 61b to 63b of the first to third exposure marks 61 to 63 are patterns of the same size, and the first to third trimming exposure marks 64 to 66 are patterns of the same design. L/S inner frame patterns 61a to 63a are composed of L/S patterns having the period P different from each other within the range satisfying the three-beam interference condition of the inequality (1). Furthermore, not only the first and second rotated exposure marks 122 and 123 shown in FIG. 6, but also pairs of rotated exposure marks having the L/S inner frame patterns allowing the period P of L/S patterns to change within the range satisfying the three-beam interference condition of the inequality (1) are disposed in the first and second aberration measurement unit regions 34, 35.

Figure 5B:
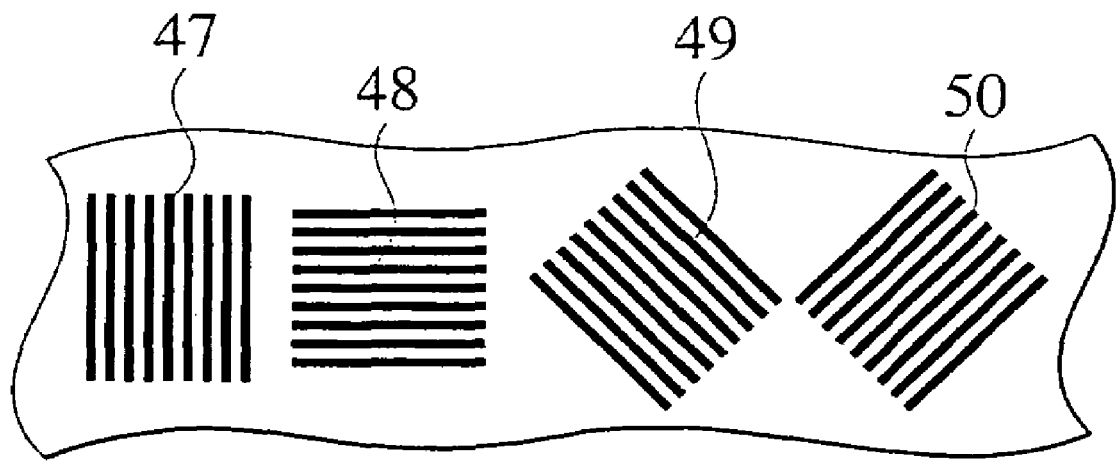

As shown in FIG. 5B, exposure marks for measuring the even function aberrations, such as spherical aberration and astigmatism, are fine L/S patterns, in which the period P satisfies the three-beam interference condition of the inequality (1). In the exposure marks for the even function aberration measurement, four kinds of marks are grouped as a set, which include a vertical L/S mark 47, a horizontal L/S mark 48, a first oblique L/S mark 49 and a second oblique L/S mark 50. When the direction of the period P of the L/S pattern of the vertical L/S mark 47 is set as a reference, the horizontal L/S mark 48 is rotated 90°, the first oblique L/S mark 49, to 135° and the second oblique L/S mark 50, to 45°. Moreover, similar to the case of the odd function aberrations, a plurality of exposure marks for even function aberration measurement are provided, which are composed of L/S patterns having a period P different from each other within the range satisfying the three-beam interference condition of the inequality (1).

As described above, in the first and second aberration measurement units $36a$ to $36i$ and $37a$ to $37i$, the plurality of exposure marks for the odd and even function aberration measurements are disposed adjacent to each other, the exposure marks having a period and direction different from each other. The arrangement of the respective exposure marks provided in the first and second aberration measurement units $36a$ to $36i$ and $37a$ to $37i$ is identical.

Next, description will be made for aberration measurements according to the embodiment of the present invention. A region of static exposure by the exposure apparatus 1 is one of the first and second aberration measurement unit regions 34 and 35 shown in FIG. 2B. Therefore, first, in the first aberration measurement unit region 34 on the photomask 33, the patterns of the exposure marks of the aberration measurement units $36a$ to $36i$ are transferred onto the wafer 10 by exposure light linearly polarized by the first polarizer 31. Thereafter, in the second aberration measurement unit region 35 on the photomask 33, the patterns of the exposure marks of the aberration measurement units $37a$ to $37i$ are transferred onto the wafer 10 by exposure light linearly polarized by the second polarizer 32. In transferring the patterns, relative positions of the respective exposure marks in the first aberration measurement unit region 34 with respect to the projection lens 5 and relative positions of the respective exposure marks in the second aberration measurement unit region 35 with respect to the projection lens 5 are made to approximately coincide with each other. Specifically, two aberration measurements are performed for images at approximately the same position. Moreover, the exposure methods for the odd function and even function aberration measurements are different from each other, and thus the respective aberration measurements are carried out separately.

Figure 8:
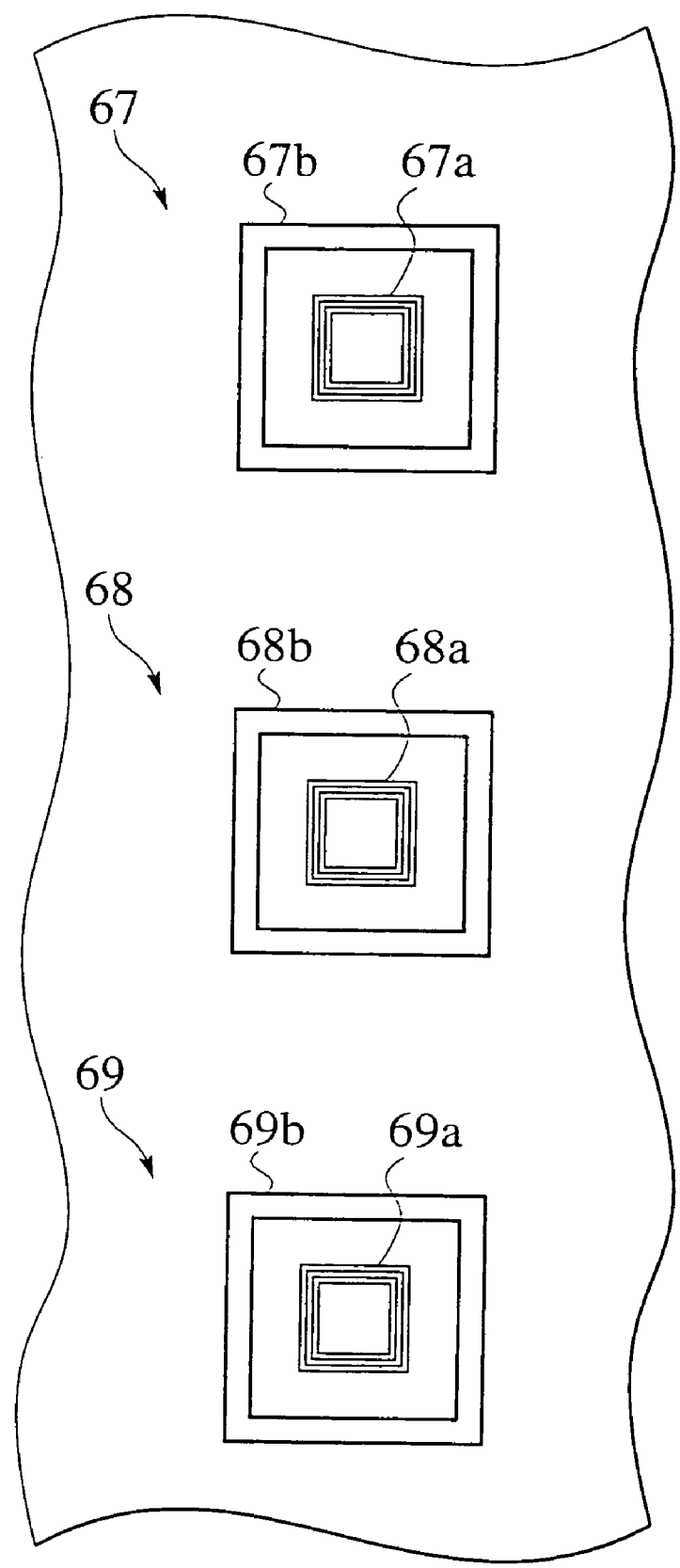
FIG. 8 is a view explaining resist patterns for the odd function aberration measurement according to the embodiment of the present invention.
Figure 9:
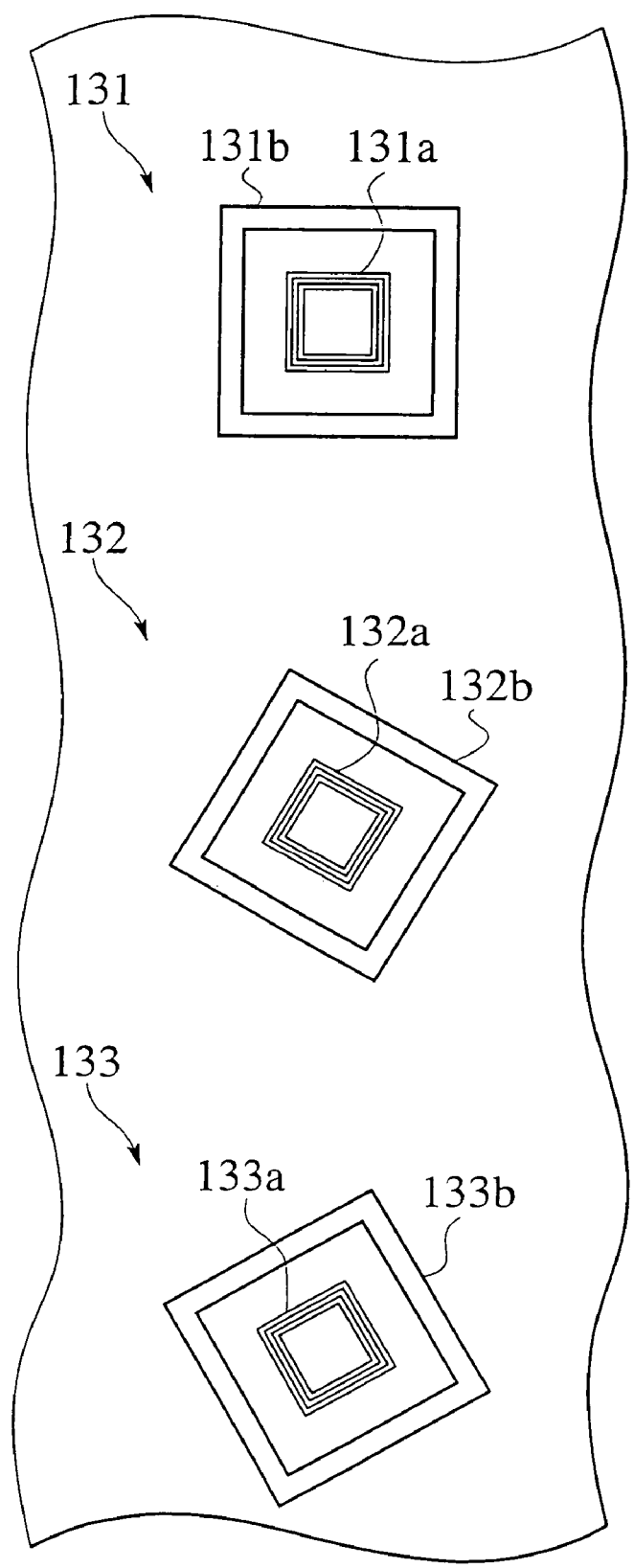
FIG. 9 a view explaining other resist patterns for the odd function aberration measurement according to the embodiment of the present invention.

In the measurement of the odd function aberrations, double exposure is performed for the first and second aberration measurement unit regions 34 and 35, respectively. In the case of performing the odd function aberration measurement by use of the exposure marks 61 to 66 of FIG. 7, for example, after the first exposure, the second exposure is performed by shifting the substrate stage 7 by 12.5 μm (50 μm on the photomask 33) in a direction in which the first to third exposure marks 61 to 63 and the first to third trimming exposure marks 64 to 66 overlap with each other. By the double exposure, the L/S inner frame patterns $61a$ to $63a$ and the outer frame patterns $61b$ to $63b$ of the first to third exposure marks 61 to 63 are transferred onto the wafer 10 with patterns to trim the portions on which the first to third trimming exposure marks 64 to 66 are overlapped. Thus, as shown in FIG. 8, first to third resist patterns 67 to 69 are formed through a development process. L/S inner frame resist patterns $67a$ to $69a$ of the first to third resist patterns 67 to 69 are L/S patterns having the width of the inner trimming patterns $64a$ to $64a$, and outer frame resist patterns $67b$ to $69b$ are patterns having the width of 0.5 μm. Similarly, the exposure mark 121 and the first and second rotated exposure marks 122 and 123 shown in FIG. 6 are trimmed by the trimming exposure mark 124 and the first and second rotated trimming exposure marks 125 and 126, respectively. Thus, as shown in FIG. 9, a resist pattern 131 and first and second rotated resist patterns 132 and 133 are formed, which are composed of L/S inner frame resist patterns $131a$ to $133a$ and outer frame resist patterns $131b$ to $133b$, respectively. By use of an overlay inspection apparatus, relative shift amounts of the transferred positions between the L/S inner frame resist patterns $67a$ to $69a$ and $131a$ to $133a$ and the outer frame resist patterns $67b$ to $69b$ and $131b$ to $133b$, respectively, are measured as shown in FIGS. 8 and 9.

Next, description will be made of a relationship between the relative shift amounts of the transferred positions, which are obtained by the odd function aberration measurements, and odd function aberration amounts. A state of forming an image of a L/S pattern is considered, which has the periodicity of the period P in the x direction and satisfies the three-beam interference condition of the inequality (1), under the coherent illumination close to σ=0. As shown in FIG. 10A, when exposure light from the light source 2 enters a mask pattern 21 and is diffracted, zeroth-order diffracted light vertically enters a substrate surface and ±first-order diffracted light enters a pupil plane 70, in an incident plane as a x-z plane at an angle θ relative to the zeroth-order diffracted light so as to sandwich the zeroth-order diffracted light therebetween. Thus, a mask pattern image 22 is imaged on a wafer. Here, the coordinate origin of a coordinate system is set to an ideal image point at which the local maximum of an interference wave emerges in the case of an aplanatic lens. Moreover, electric field vectors of the respective diffracted light, in which traveling direction is a positive z direction, are $E_0$, $E_1$ and $E_{-1}$, an exposure wavelength is λ, an amplitude of the zeroth-order diffracted light is A and an amplitude of the ±first-order diffracted light is B. Moreover, taking a phase of the zeroth-order diffracted light as a reference, phase errors of ±first-order diffracted light are $\phi_1$ and $\phi_{-1}$, respectively. In general, the electric vector of light, of which the time-dependent part is omitted, is expressed in the following equation, $$E = A^* \exp(i^* k^* x). \quad (2)$$

Here, i is an imaginary unit, k is a wave vector and x is a position vector. Therefore, the electric vectors of the respective diffracted light are expressed in the following equations, $$E_0(x,y,z) = A^* \exp(i^* k^* z), \quad (3)$$

$$E_1(x,y,z) = B^* \exp\{i \cdot (-k^* x^* \sin\theta + k^* z^* \cos\theta + \phi_1)\}, \quad (4)$$

$$E_{-1}(x,y,z) = B^* \exp\{i^* (k^* x^* \sin\theta + k^* z^* \cos\theta + \phi_{-1})\}. \quad (5)$$

The interference wave I formed on the wafer is expressed in the following equation, $$I = |E_0 + E_1 + E_{-1}|^2. \quad (6)$$

When the equation (6) is expanded, $$I = A^2 + 2^* B^2 + 2^* A^* B^* \cos(S^* k^* x - \phi_{odd})^* \cos(C^* k^* z - \phi_{even}) + 2^* B^{2^*} \cos\{2^*(S^* k^* x - \phi_{odd})\}. \quad (7)$$

Here, for simplicity, substitutions are used, which are S=sin θ, C=1−cos θ, $\phi_{even} = (\phi_1 + \phi_{-1})/2$, and $\phi_{odd} = (\phi_1 - \phi_{-1})/2$. $\phi_{even}$ is an even function aberration component and $\phi_{odd}$ is an odd function aberration component. Considering the behavior of the x-y plane by fixing z, it has been determined that the local maximum position of the interference wave in the vicinity of the origin exists at the point obtained by $S^* k^* x - \phi_{odd} = 0$, that is, the point obtained by the following equation, $$x = \phi_{odd}/(S^* k). \quad (8)$$

When it is considered that the incident angle θ of the ±first-order diffracted light, the L/S pattern period P and the exposure wavelength λ have the following relationship, $$\sin\theta = \lambda/P, \quad (9)$$

the relative transferred position shift amount δx of the L/S pattern is expressed in the following equation, $$\delta x = P * \phi_{odd}/(2*\pi). \tag{10}$$

Furthermore, the outer frame pattern 42 shown in FIG. 5A, for example, has a pattern width sufficiently large for the exposure wavelength λ. The exposure light passing through the projection lens passes through the center of the pupil plane 70. Normally, the center of the projection lens is well adjusted. Thus, the wavefront aberration can be considered 0 at the center of the pupil plane 70. Therefore, the position of the outer frame pattern 42 does not change in most cases and thus can be a position reference mark. In other words, from the relative transferred position shift amount δx measured by use of the overlay inspection apparatus, the odd function aberration $\phi_{odd}$ is obtained by the following equation, $$\phi_{odd} = 2*\pi*\delta x/P. \tag{11}$$

Here, the aberration is expressed in the dimension of the phase. In the notation by the exposure wavelength λ, the following equation is obtained, $$\phi_{odd} = \delta x/P. \tag{12}$$

This $\phi_{odd}(R, \theta)$ represents an odd function component of a wavefront aberration at the coordinates $(R, \theta)$ within the pupil plane 70 of the aperture stop 6 of the projection optical system 9. The pupil plane 70 is defined as a unit circle having a radius of 1. The radius vector R of the pupil plane 70 is $0 \leq R \leq 1$. When exposing the L/S pattern of the period P, the zeroth-order diffracted light passes through the center of the pupil plane 70 and ±first-order diffracted light passes through the position moved by λ/(P*NA) from the center of the pupil plane 70 to the period direction of the L/S pattern. The distances between the diffracted light passing positions and the center of the pupil plane 70 are in inverse proportion to the period P of the L/S pattern. When the period P is large, as shown in FIG. 10B, the diffracted light passes through comparatively inner positions, which are away from the center of a pupil plane 70a by $R_1$. When the period P is small, as shown in FIG. 10C, the diffracted light passes through comparatively outer positions, which are away from the center of a pupil plane 70b by $R_2$. In other words, an odd function aberration component at $(R, \theta)$ on the pupil plane 70 defined as a unit circle is $\phi_{odd}$, and an odd function aberration component at $(R, \theta+180°)$ thereon is $-\phi_{odd}$. Specifically, the following equations are obtained, $$\phi_{odd}(R, \theta) = \delta x/P, \tag{13}$$

$$\phi_{odd}(R, \theta+180°) = -\delta x/P. \tag{14}$$

Note that the radius vector R has the following relationship with λ, P and NA, $$R = \lambda/(P*NA). \tag{15}$$

Considering the above, by the measurements of the aberration measurement patterns formed of the exposure marks having a different period P and rotated angles different from each other, the odd function aberration components $\phi_{odd}(R, \theta)$ at different positions on the pupil plane 70 are obtained. For example, from a measurement of an aberration measurement pattern formed of an exposure mark, which has a period of $P_0$ and is rotated by 30°, the following are obtained: $\phi_{odd}(\lambda/(P_0*NA), 30°)$ and $\phi_{odd}(\lambda/(P_0*NA), -150°) = -\phi_{odd}(\lambda/(P_0*NA), 30°)$.

Next, Zernike aberration coefficients of the odd function aberrations are calculated from the obtained $\phi_{odd}$. The odd function aberrations are divided into 1θ components, 3θ components and 5θ components by use of the following matrix calculation described in "OPTICAL REVIEW," Vol. 7 (2000), Pages 525-534.

$$\begin{pmatrix} \phi_{\cos\theta}(R) \\ \phi_{\sin\theta}(R) \\ \phi_{\cos 3\theta}(R) \\ \phi_{\sin 3\theta}(R) \\ \phi_{\cos 5\theta}(R) \\ \phi_{\sin 5\theta}(R) \end{pmatrix} = \frac{1}{3} \begin{pmatrix} 1 & \sqrt{3}/2 & 1/2 & 0 & -1/2 & \sqrt{3}/2 \\ 0 & 1/2 & \sqrt{3}/2 & 1 & \sqrt{3}/2 & 1/2 \\ 1 & 0 & -1 & 0 & 1 & 0 \\ 0 & 1 & 0 & -1 & 0 & 1 \\ 1 & -\sqrt{3}/2 & 1/2 & 0 & -1/2 & \sqrt{3}/2 \\ 0 & 1/2 & -\sqrt{3}/2 & 1 & \sqrt{3}/2 & 1/2 \end{pmatrix} \begin{pmatrix} \phi_{odd}(R, 0°) \\ \phi_{odd}(R, 30°) \\ \phi_{odd}(R, 60°) \\ \phi_{odd}(R, 90°) \\ \phi_{odd}(R, 120°) \\ \phi_{odd}(R, 150°) \end{pmatrix} \tag{16}$$

Next, the 1θ components and 3θ components of the odd function aberrations are fit into radial functions, thus obtaining coefficients.

$$\phi_{\cos\theta}(R) = a_2*Z_2(R) + a_7*Z_7(R) + a_{14}*Z_{14}(R) + \tag{17}$$

$$\phi_{\sin\theta}(R) = a_3*Z_3(R) + a_8*Z_8(R) + a_{15}*Z_{15}(R) + \tag{18}$$

$$\phi_{\cos 3\theta}(R) = a_{10}*Z_{10}(R) + a_{19}*Z_{19}(R) + \tag{19}$$

$$f_{\sin 3?}(R) = a_{11}*Z_{11}(R) + a_{20}*Z_{20}(R) + \tag{20}$$

Here, $a_n$ (n is an integer) is a Zernike aberration coefficient of the nth term, and $Z_n(R)$ is radius R dependent portion of a Zernike polynomial of the nth term. In such a manner, the coma aberrations $a_7$ and $a_8$; 3θ aberrations $a_{10}$ and $a_{11}$; and high-order components thereof $a_{14}$, $a_{15}$, $a_{19}$ and $a_{20}$ are obtained.

Next, description will be made for measurements of the even function aberrations. The four types of L/S marks 47 to 50 shown in FIG. 5B are exposed on the wafer 10 coated with a resist film while changing focus positions and transferring positions gradually with a fixed exposure amount. The L/S resist pattern transferred by changing focus states as described above is measured by use of a scanning electron microscope (SEM) and the like. The line width of each L/S resist pattern has a local maximum value in accordance with the change of the focus state. The focus state where the line width has the local maximum value is a state where a contrast of an interference wave formed in the three-beam interference shows a local maximum, that is, the focus state is the best focus. The best focus is determined for each of the respective patterns having periods and directions different from each other. To be specific, at each of the focus positions, that is, at each of defocus distances set in the exposure apparatus, a position taking the local maximum value of the line width of the L/S resist pattern or the local minimum value of the space width thereof becomes a position of the best focus. For example, as shown in FIG. 11, vertical L/S resist patterns 111a to 111g are transferred in the range where the defocus distance is −0.2 to 0.4 μm, and the best focus thereof is at the position where the defocus distance is 0.1 μm. Similarly, for horizontal L/S resist patterns 112a to 112g, first oblique L/S resist patterns 113a to 113g and second oblique L/S resist patterns 114a to 114g, the best focus position is at the positions where the defocus distances are 0, −0.1 and 0, respectively. Note that, by using, for example, the outer frame pattern 42 of the exposure mark 43 shown in FIG. 5A, the position where the defocus distance is 0 is set by previously obtaining an approximately best focus position by the exposure apparatus.

Next, description will be made for a relationship between a shift of the best focus and an even function aberration amount. In the equation (7) of the interference wave formed on the wafer 10 by the three-beam interference, a case is considered where the wafer is shifted in a traveling direction of light (z direction). Since the third term of the right-hand side in the equation (7) determining a contrast has z dependence, a condition for obtaining the best focus is expressed in the following equation, $$C*k*z - \phi_{even} = 0. \quad (21)$$

Specifically, a shift amount $\delta z$ from the aplanatic case of the best focus is in proportion to the even function aberration components $\phi_{even}$. To be more specific, considering that the incident angle $\theta$ of the ±first-order diffracted light, the L/S period P and the exposure wavelength $\lambda$ have the relationship of the equation (9), the following equation can be expressed, $$\phi_{even} = C*k*\delta z = 2*\pi*\kappa(\lambda, P)*\delta z/\lambda. \quad (22)$$

Here, $\kappa(\lambda, P) = 1 - (1 - \lambda^2/P^2)^{1/2}$. The equation (22) is expressed in the phase dimension. The following equation is obtained in unit of the wavelength unit, $$\phi_{even} = C*k*\delta z = \kappa(\lambda, P)*\delta z/\lambda. \quad (23)$$

$\phi_{even}(R, \theta)$ represents even function components of wavefront aberrations at the coordinates $(R, \theta)$ within the pupil plane of the projection lens 5. In other words, on the pupil plane 70 defined by a unit circle, even function aberration components at $(R, \theta)$ and $(R, \theta+180°)$ are $\phi_{even}$. Specifically, $$\phi_{even}(R, \theta) = \phi_{even}(R, \theta+180°) = \kappa(\lambda, P)*\delta z/\lambda. \quad (24)$$

Considering the fact described above, by the measurements of the L/S resist patterns formed from the exposure marks having periods P and angles different from each other, the even function aberration components $\phi_{even}(R, \theta)$ at different positions on the pupil plane 70 are obtained. For example, from a measurement of a L/S resist pattern formed from a mark, which has a period of $P_0$ and is rotated by 45°, the following equation is obtained.

$$\phi_{even}(\lambda/(P_0*NA), 45°) = \phi_{even}(\lambda/(P_0*NA), -135°). \quad (25)$$

Next, from the shift amount $\delta z$ of the best focus, the Zernike aberration coefficients of the even function aberrations are calculated. By a calculation below, which is described in "OPTICAL REVIEW," the even function aberrations are divided into 0θ component $\phi_{sym}(R)$, 2θ component $\phi_{cos\,2\theta}(R)$, $\phi_{sin\,2\theta}(R)$ and the like.

$$\begin{pmatrix} \phi_{sym}(R) \\ \phi_{cos2\theta}(R) \\ \phi_{sin2\theta}(R) \\ \phi_{cos4\theta}(R) \end{pmatrix} = \frac{1}{4} \begin{pmatrix} 1 & 1 & 1 & 1 \\ 2 & 0 & -2 & 0 \\ 0 & 2 & 0 & -2 \\ 1 & -1 & 1 & -1 \end{pmatrix} \begin{pmatrix} \phi_{even}(R, 0°) \\ \phi_{even}(R, 45°) \\ \phi_{even}(R, 90°) \\ \phi_{even}(R, 135°) \end{pmatrix}. \quad (26)$$

Next, 0θ component $\phi_{sym}(R)$ 2θ component $\phi_{cos\,2\theta}(R)$ and $\phi_{sin\,2\theta}(R)$ are fit into radial functions, thus obtaining coefficients.

$$\phi_{sym}(R) = a_4*Z_4(R) + a_9*Z_9(R) + a_{16}*Z_{16}(R) +, \quad (27)$$

$$\phi_{cos\,2\theta}(R) = a_5*Z_5(R) + a_{12}*Z_{12}(R) +, \quad (28)$$

$$\phi_{sin\,2\theta}(R) = a_6*Z_6(R) + a_{13}*Z_{13}(R) + \quad (29)$$

As described above, the spherical aberration $a_9$, the astigmatism $a_5$ and $a_6$, and high-order components thereof $a_{16}$, $a_{12}$ and $a_{13}$ are obtained.

Figure 12:
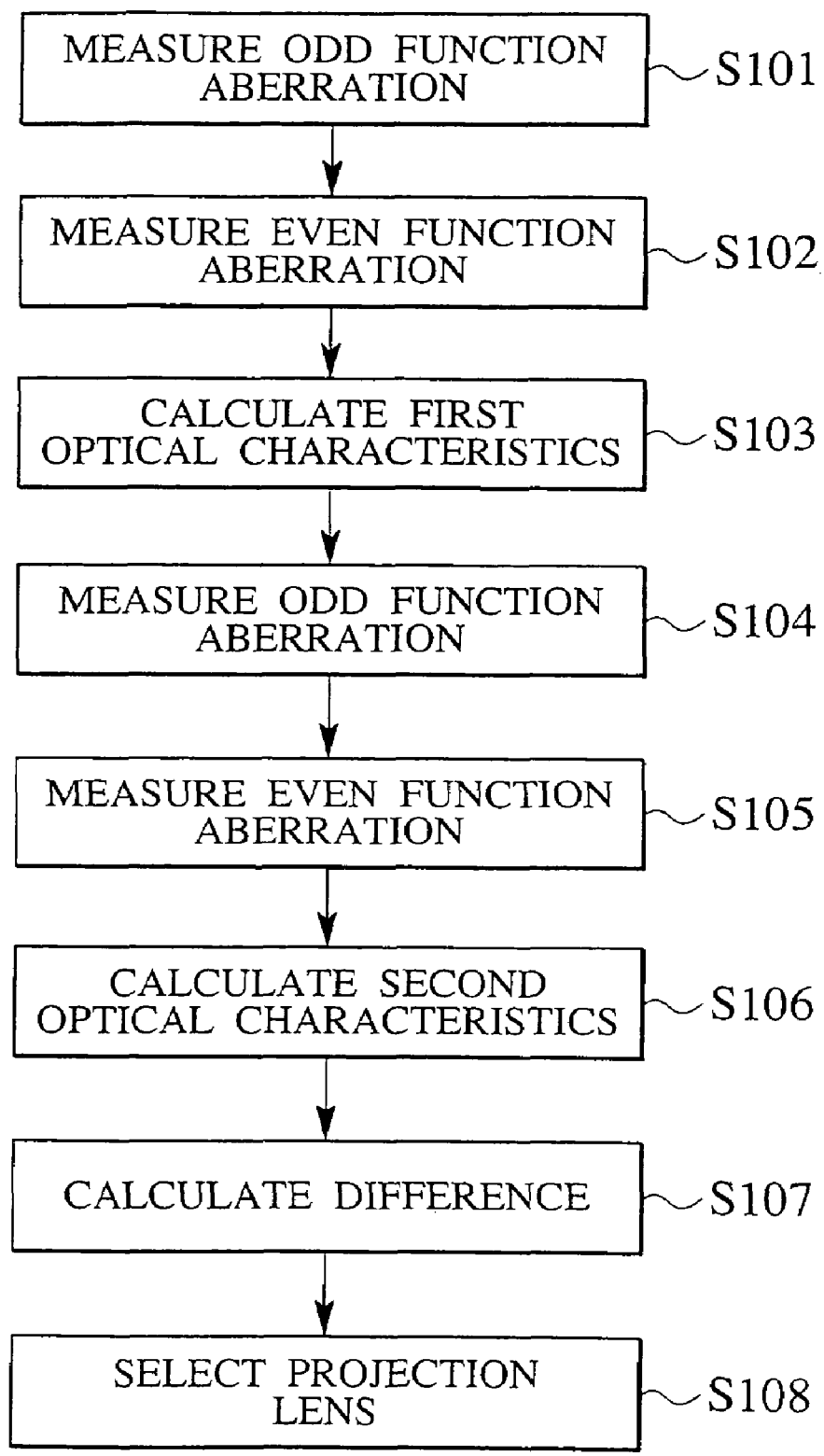
FIG. 12 is a flowchart used for explaining an inspection method for a projection optical system according to the embodiment of the present invention.

From the flowchart of FIG. 12, description will be made for a method for inspecting performance of the projection lens according to the embodiment of the present invention.

(a) First, the photomask 33 and the wafer 10 coated with a first resist film are mounted on the mask stage 4 and the substrate stage 7 of the exposure apparatus 1. In Step S101, double exposure is performed, for example, by use of the exposure marks for the odd function aberration measurement, which are shown in FIGS. 5A, 6 and 7, in the first aberration measurement unit region 34. Then, by the exposure light linearly polarized by the first polarizer 31, the respective L/S patterns are transferred onto the first resist film on the wafer 10. After development of the first resist film, a lateral shift amount $\delta x$ is measured from the L/S resist patterns as shown in FIGS. 8 and 9.

(b) The wafer 10 coated with a second resist film is mounted on the exposure apparatus. In Step S102, the respective L/S patterns are transferred onto the second resist film on the wafer by the exposure light linearly polarized by the first polarizer 31 by use of exposure marks for the even function aberration measurement, which are shown in FIG. 5B, in the first aberration measurement unit region 34 while changing focus positions and transferring positions with a fixed exposure amount. After development of the second resist film, a best focus shift amount $\delta z$ is measured from the L/S resist patterns as shown in FIG. 11.

(c) In Step S103, from the lateral shift amount $\delta x$ and the best focus shift amount $\delta z$ due to the exposure light linearly polarized by the first polorizer 31, first Zernike aberration coefficients are calculated as first optical characteristics. For example, Zernike coefficients $a_7$ and $a_8$ of coma aberrations and Zernike coefficients $a_{10}$ and $a_{11}$ of 3θ aberrations are calculated as the odd function aberrations. Moreover, Zernike coefficients $a_5$ and $a_6$ of astigmatism and a Zernike coefficient $a_9$ of a spherical aberration are calculated as the even function aberrations.

(d) Next, in Step S104, the wafer 10 coated with a third resist film is mounted on the exposure apparatus. Double exposure is performed by use of the exposure marks for the odd function aberration measurement, which are shown in FIGS. 5A, 6 and 7, in the second aberration measurement unit region 35. Then, by the exposure light linearly polarized by the second polarizer 32, the respective L/S patterns are transferred onto the third resist film on the wafer 10. After development of the third resist film, a lateral shift amount $\delta x$ is measured from the L/S resist patterns as shown in FIGS. 8 and 9.

(e) The wafer 10 coated with a fourth resist film is mounted on the exposure apparatus. In Step S105, the respective L/S patterns are transferred onto the fourth resist film on the wafer by the exposure light linearly polarized by the second polarizer 32 by use of the exposure marks for the even function aberration measurement, which are shown in FIG. 5B, in the second aberration measurement unit region 35 while changing focus positions and transferring positions with a fixed exposure amount. After development of the fourth resist film, a best focus shift amount $\delta z$ is measured from the L/S resist patterns as shown in FIG. 11.

(f) In Step S106, from the lateral shift amount $\delta x$ and the best focus shift amount $\delta z$ due to the exposure light linearly polarized by the second polarizer 32, second Zernike aberration coefficients are calculated as second optical characteristics. Similar to the Step 103, Zernike coefficients $a_7$ and $a_8$ for coma aberrations and Zernike coefficients $a_{10}$ and $a11$ for 3θ aberrations are calculated as the odd function aberrations, and Zernike coefficients $a_5$ and $a_6$ of astigmatism and a Zernike coefficient $a_9$ of a spherical aberration are calculated as the even function aberrations.

(g) In Step S107, differences between the calculated first and second Zernike aberration coefficients are obtained as differences between the first and second optical characteristics. In Step S108, based on the obtained Zernike aberration coefficient difference, the performance of the projection lens 5 is determined, and the projection lens 5 is selected.

Figures 13, 14:
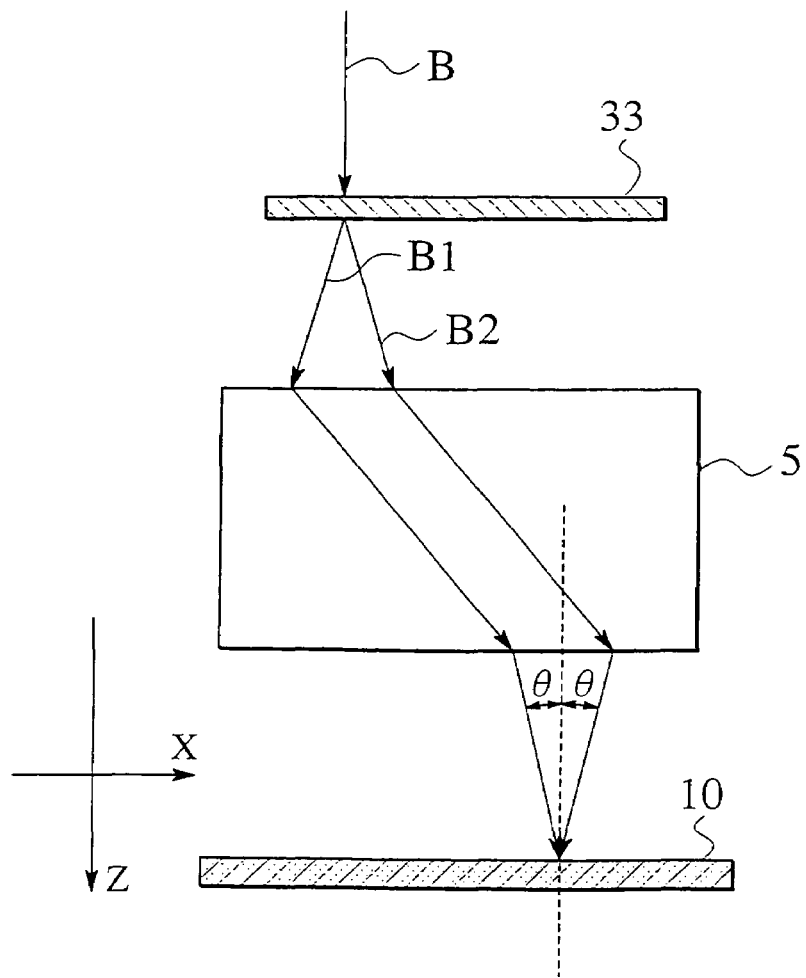
FIG. 13 is a table showing measurement results of Zernike aberration coefficients according to the embodiment of the present invention.
FIG. 14 is a view explaining two-beam interference according to the embodiment of the present invention.

In the table of FIG. 13, the first and second Zernike aberration coefficients, which are calculated in tests 1 and 2, and the Zernike aberration coefficient differences are shown. If birefringence of the projection lens 5 is sufficiently suppressed, there is no difference between the results of the tests 1 and 2. On the other hand, if the birefringence of the projection lens 5 is large, effective aberrations of the projection lens 5 are changed depending on polarization states of the light. Thus, measurement results obtained from the two exposures, which are performed by changing the polarization states of the exposure light, are different from each other. In FIG. 13, the Zernike aberration coefficient differences obtained from the two tests are 10% or more of the Zernike aberration coefficients measured in the test 1. Thus, it can be determined that the projection lens 5 shows a large birefringence.

If the projection lens shows no birefringence, polarization states of incident light and outgoing light are the same. On the other hand, when a material showing birefringence is used, the polarization states of the incident light and outgoing light are changed. In the case where polarized light enters a transparent material which shows birefringence, the polarization state of the outgoing light is expressed in the following equation.

$$\begin{pmatrix} E_p' \\ E_s' \end{pmatrix} = M \begin{pmatrix} E_p \\ E_s \end{pmatrix}. \tag{30}$$

Here, $(E_p, E_s)$ are p polarization component and s polarization component of an electric field vector of the incident light, $(E_p', E_s')$ are p polarization component and s polarization component of an electric field vector of the outgoing light and M is a Jones matrix related to an optical path within the light transmitting material.

Fluorite used as a lens material of the exposure apparatus 1 has different magnitudes of birefringence depending on crystal orientations. Therefore, the fluorite receives changes of polarization states differently depending on paths through which the exposure light passes. The above-described state can be expressed by a 2×2 matrix M defined at an arbitrary point on the pupil plane of the aperture stop 6. The matrix M is a function of pupil coordinates and image surface coordinates. Moreover, when image formation at a certain image point is considered, the matrix M is a function of the pupil coordinates.

In the exposure apparatus 1, diffracted light emitted from the photomask 33 enters the projection lens 5, and light passing through the projection lens 5 reaches the wafer 10. On the surface of the wafer 10, an image is formed by interferences of two or more light fluxes. As to the interferences of the light fluxes, polarized light orthogonal to each other does not interfere with each other, thus producing no contrast of the image. In the case where light fluxes interfering with each other are in polarization states different from each other, the contrast of the image is decreased, thus making it difficult to perform a normal pattern formation.

Here, description will be made for influences of birefringence by taking image formation by two-beam interference as an example. As shown in FIG. 14, exposure light B is polarized and diffracted by a polarizer and L/S exposure marks of the photomask 33, thus obtaining first and second polarized light beams B1 and B2. FIG. 14 shows that two light fluxes of the first and second polarized light beams B1 and B2, which had the same intensity and were in the same polarization state before entering the projection lens, pass through different paths in the projection lens 5 and the two beams enter the surface of the wafer 10 from an angle which is oblique to a normal line of the wafer by an angle θ on the same incident plane (x-z plane of FIG. 14). Here, the polarization states of the first and second polarized light beams B1 and B2 entering the surface of the wafer 10 are expressed by using a component parallel to the incident plane (p polarization component) and a component vertical to the incident plane (s polarization component). The polarization state of the first polarized light beam B1 and the polarization state of the second polarized light beam B2 are assumed to be expressed as $(E_{1p}, E_{1s})$ and $(E_{2p}, E_{2s})$, respectively. Assuming that a phase difference between the p polarization and the s polarization is $\phi_{\gamma b}$ ($\gamma$ is 1 or 2), the p polarization component and s polarization component of the electric field vector of the light are expressed as below. Note that a time-dependent term is omitted.

$$E_{\gamma p} = A_{\gamma p} * \exp\{i*(k_\gamma *x + \phi_\gamma + \phi_{\gamma b}/2)\}, \tag{31}$$

$$E_{\gamma s} = A_{\gamma s} * \exp\{i*(k_\gamma *x + \phi_\gamma + \phi_{\gamma b}/2)\}. \tag{32}$$

$\phi_\gamma$ represents an average phase of the s polarization and p polarization states, i is an imaginary unit and x is a position vector. $A_{\gamma p}$ and $A_{\gamma s}$ represent amplitudes of the p polarization component and s polarization component of the electric field, respectively. A wave vector $k_\gamma$ is specifically expressed in the following equations.

$$k_1 = 2*\pi/\lambda(\sin \theta, 0, \cos \theta), \tag{33}$$

$$k_2 = 2*\pi/\lambda(-\sin \theta, 0, \cos \theta). \tag{33}$$

Under such a condition, the interference wave I on the surface of the wafer is expressed by the sum of an interference wave $I_p$ of the p polarization and an interference wave $I_s$ of the s polarization when it is considered that the p polarized light and the s polarized light do not interfere with each other, the vibration planes of the electric fields thereof being orthogonal to each other. Specifically, $$I_p = |E_{1p} + E_{2p}|^2 = |A_{1p}|^2 + |A_{2p}|^2 + 2*A_{1p}*A_{2p}*(2*k*x*\sin\theta + \Delta\phi + \Delta\phi_b), \tag{35}$$

$$I_s = |E_{1s} + E_{2s}|^2 = |A_{1s}|^2 + |A_{2s}|^2 + 2*A_{1s}*A_{2s}*(2*k*x*\sin\theta + \Delta\phi - \Delta\phi_b), \tag{36}$$

$$I = I_p + I_s \tag{37}$$
$$= I_1 + I_2 + A_p * \cos(2*k*x*\sin\theta + \Delta\phi + \Delta\phi_b) +$$
$$A_s * \cos(2*k*x*\sin\theta + \Delta\phi - \Delta\phi_b).$$

Note that $I_1$ and $I_2$ are intensities of the beams 1 and 2, respectively, $A_p = 2*A_{1p}*A_{2p}*\cos(2*\theta)$ is an amplitude of an interference wave of two beams of p polarized light and $A_s = 2*A_{1s}*A_{2s}$ is an amplitude of an interference wave of two beams of s polarized light. The magnitude of the wave vector is k, $\Delta\phi = \phi_1 - \phi_2$ is a phase difference of two luminous fluxes unrelated to polarization and $\Delta\phi_b=\phi_{1b}-\phi_{2b}$ is a phase difference of two luminous fluxes dependent on a magnitude of the polarization. From the equation (37), it is found that an image formed on the surface of the wafer 10 is expressed by superposition of the interference wave of the two beams of p polarized light and the interference wave of the two beams of s polarized light. Moreover, aberrations are different for each of the interference waves, and the aberration of the p polarization component and the aberration of the s polarization component are obtained by the following equations.

$$\Phi_p = \Delta\phi + \Delta\phi_b, \quad (38)$$

$$\Phi_s = \Delta\phi - \Delta\phi_b. \quad (39)$$

An effective aberration Φ affecting the whole image can be approximated by the equation below by using the vibration component $A_p$ of the interference wave of the p polarization, the aberrations $\Phi_p$ of the p polarization, the vibration component $A_s$ of the interference wave of the s polarization and the aberrations $\Phi_s$ of the s polarization.

$$\Phi \approx (A_p{}^*\Phi_p + A_s{}^*\Phi_s)/(A_p+A_s) = \Delta\phi + \Delta\phi_b{}^*(A_p-A_s)/(A_p+A_s). \quad (40)$$

$A_p$ and $A_s$ are values determined depending on the polarization states of the two light fluxes and are magnitudes of the respective components of the vector, which is obtained by multiplying the vector representing the polarization state of the incident light by the matrix M, as shown in the equation (30). Specifically, the polarization states of the two light fluxes are changed depending on the polarization state of the light entering the projection lens 5. Therefore, by changing the polarization state of the light before the light enters the projection lens 5, influences of the aberrations to the image on the surface of the wafer 10 differ. In other words, depending on the polarization state of the light at the entrance side, values of the aberrations obtained by measuring the resist patterns for aberration measurement formed on the surface of the wafer 10 are changed. When birefringence of the projection lens 5 is sufficiently small, the polarization state of the light passing through the projection lens 5 is not changed. In this event, the matrix M is a unit matrix. Therefore, since $\phi_{1b}=\phi_{2b}$ and $\Delta\phi_b=0$, regardless of the polarization state at the entrance side, Φ in the equation (40) is set constant. Specifically, if the values of the aberrations obtained by measuring the resist patterns for aberration measurement formed on the surface of the wafer 10 are not changed depending on the polarization state of the light at the entrance side, it is possible to determine that the birefringence of the projection lens 5 is sufficiently small.

Here, a description has been made by taking the two-beam interference as an example. However, also in the case of the three-beam interference, the same argument is established. Specifically, the aberration measurement by the exposure, in which the polarization states of the incident light are changed, enables examination of the magnitude of the birefringence of the projection lens 5.

Other Embodiments

As described above, the present invention has been described according to the embodiments. However, it should be understood that the description and drawings constituting a part of this disclosure are not limitations to the invention. Various alternative embodiments, embodiments and operation techniques will become apparent to those skilled in the art from this disclosure.

Figure 15A:
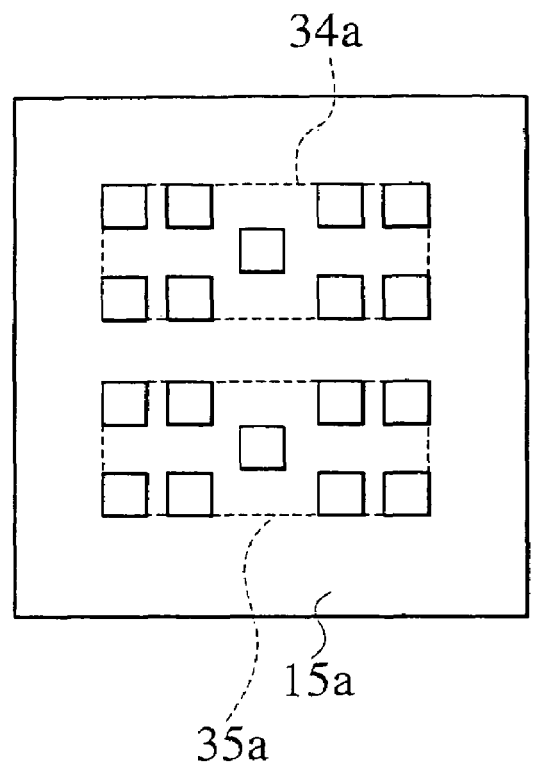
FIGS. 15A and 15B are views explaining one example of a constitution of a photomask according to another embodiment of the present invention.
Figure 15B:
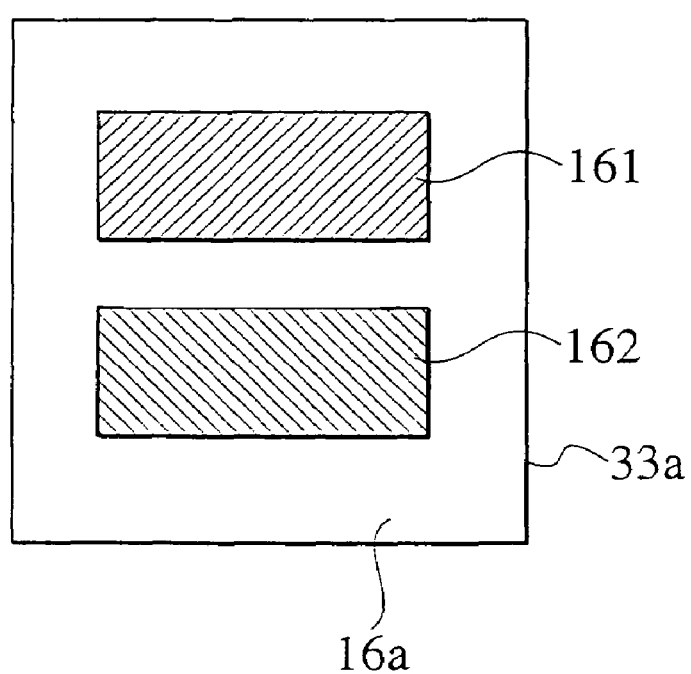

As to the photomask 33 according to the embodiment of the present invention, the first and second wire grid polarizers 31 and 32 are arranged to be parallel to the end faces of the photomask 33. However, as shown in FIGS. 15A and 15B, the polarizers may be arranged below. Specifically, first and second polarizers 161 and 162 disposed on a second surface 16a may be arranged so as to be opposite to first and second aberration measurement unit regions 34a and 35a disposed on a first surface 15a of a photomask 33a and so as to have directions of their wire grid patterns orthogonal to each other in an oblique and different direction from end faces of the photomask 33a. Even in such a case, linear polarizations orthogonal to each other can be achieved by the first and second polarizers 161 and 162. Thus, it is needless to say that a similar effect to the embodiment of the present invention can be obtained.

Figure 16A:
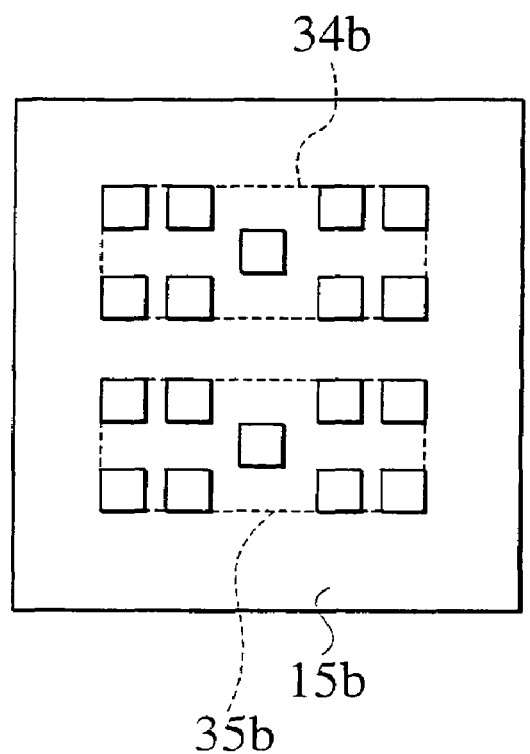
FIGS. 16A and 16B are views explaining another example of a constitution of a photomask according to the other embodiment of the present invention.
Figure 16B:
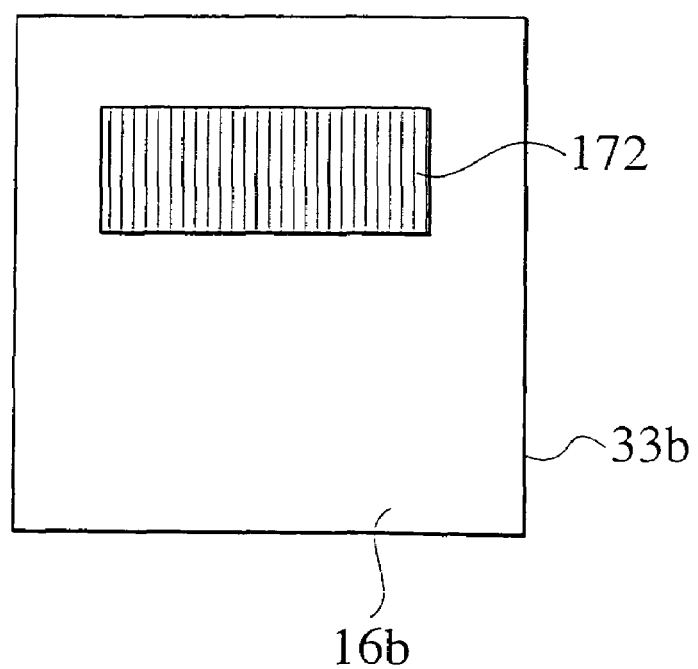

Moreover, as shown in FIG. 16, a structure described below may be adopted. Specifically, in the structure, a polarizer 172 is disposed on a second surface 16b while being opposite to a first aberration measurement unit region 34b on a first surface 15b of a photomask 33b, and no grid polarizer is disposed in a region on a second surface 16b, the region being opposite to a second aberration measurement unit region 35b. In this case, based on states of polarized light and nonpolarized light, inspection is performed by use of a difference between aberrations in the projection lens 5.

Figure 17A:
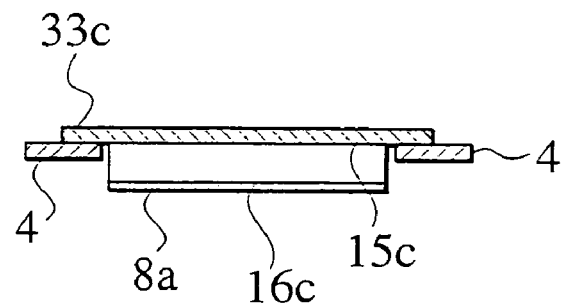
FIGS. 17A through 17C are views explaining one example of a configuration of a photomask and a pellicle according to the other embodiment of the present invention.
Figure 17B:
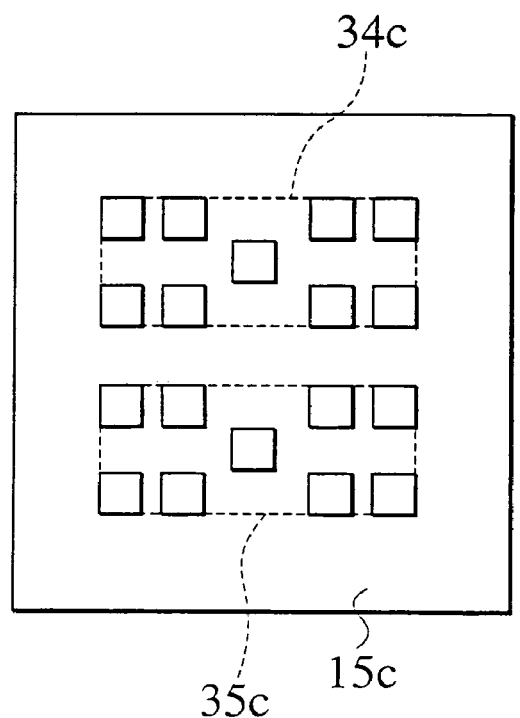
Figure 17C:
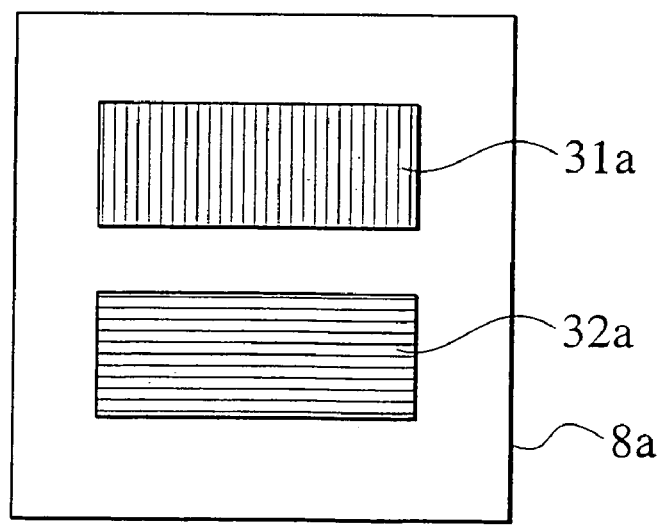
Figure 18:
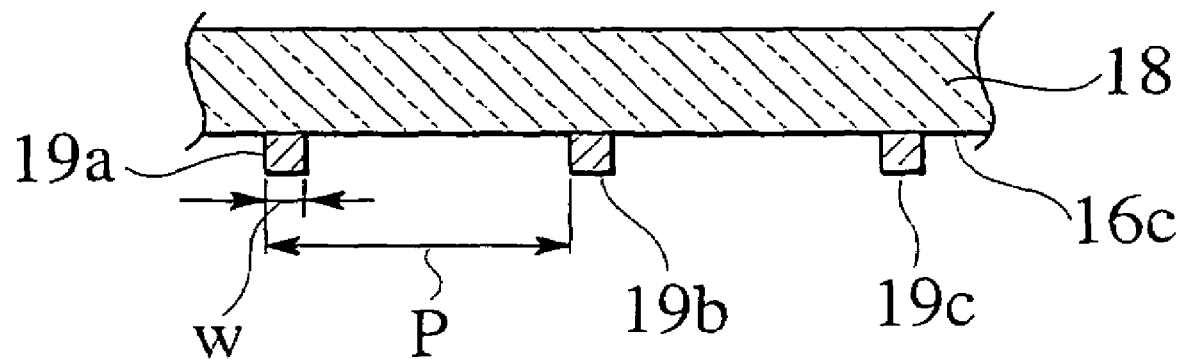
FIG. 18 is a view of a cross-section structure of a pellicle according to the other embodiment of the present invention.

Moreover, in the embodiment of the present invention, the wire grid polarizers are disposed on the second surface 16 of the photomask 33. However, the wire grid polarizers may be disposed not on the photomask 33 but on the pellicle 8. As shown in FIG. 17A, a pellicle 8a is provided in order to prevent adhesion of dust on a photomask 33c. On the photomask 33c, as shown in FIG. 17B, first and second aberration measurement unit regions 34c and 35c are disposed on a first surface 15c thereof. As shown in FIG. 17C, on a second surface 16c of the pellicle 8a, first and second polarizers 31a and 32a are respectively disposed at positions opposite to the first and second aberration measurement unit regions 34c and 35c on the first surface 15c. The pellicle 8a has a structure, as shown in FIG. 18, in which, on the second surface 16c of a transparent substrate 18 similar to the photomask 33c, opaque portions 19a to 19c with a opaque portion width w are disposed at a period P of a L/S pattern. A polarization state of exposure light transmitted through the photomask 33c is not changed. Thus, it is needless to say that, even if the wire grid polarizers are on the pellicle 8a, a similar effect to the embodiment of the present invention can be obtained. Note that, even if the first and second polarizers 31a and 32a are disposed on a surface of the pellicle 8a, which is opposite to the photomask 33c, or on a reverse surface thereof, it is needless to say that a similar effect can be obtained.

Furthermore, in the embodiment of the present invention, as the aberrations of the projection lens 5, the odd function aberrations, which are the coma aberration and 3θ aberration, and the even function aberrations, which are the spherical aberration and astigmatism, are used. However, the birefringence inspection of the projection lens is possible as long as at least one of the above four types of aberrations is used. Alternatively, it is needless to say that one of the odd function aberrations and the even function aberrations may be used. Moreover, the method for measuring aberrations of the projection lens 5 is not limited to the method used in the description and it is needless to say that other methods are applicable.

What is claimed is:

1. A photomask, comprising:
a transparent substrate having a first surface and a second surface opposite to the first surface;

a first aberration measurement unit disposed on a first region of the first surface;

a second aberration measurement unit disposed on a second region of the first surface, the second region away from the first region; and a first polarizer disposed on the second surface so as to be opposite to the first aberration measurement unit.

2. The photomask of claim 1, further comprising:

a second polarizer disposed on the second surface so as to be opposite to the second aberration measurement unit.

3. The photomask of claim 2, wherein the first polarizer polarizes an exposure light to a first polarization state; and the second polarizer polarizes the exposure light to a second polarization state different from the first polarization state.

4. The photomask of claim 3, wherein each of the first and second polarizers is provided by a line and space pattern.

5. The photomask of claim 1, wherein each of the first and second aberration measurement units has a plurality of aberration measurement marks which include a line and space pattern having a period so as to satisfy one of a three-beam interference condition and a two-beam interference condition.

6. The photomask of claim 3, wherein the first polarization state is a linearly polarized state.

7. The photomask of claim 3, wherein a polarization plane of the second polarization state is orthogonal to a polarization plane of the first polarization state.

8. The photomask of claim 4, wherein a period of the line and space pattern of each of the first and second polarizers is equal to or less than a wavelength of an exposure light.

9. The photomask of claim 1, wherein the first aberration measurement unit configured to measure a first optical characteristic of a projection optical system by transferring an image of the first aberration measurement unit on a wafer through the projection optical system by use of an exposure light, and the second aberration measurement unit configured to measure a second optical characteristic of the projection optical system by transferring an image of the second aberration measurement unit on the wafer through the projection optical system by use of an exposure light.

10. A photomask, comprising:

a transparent substrate having a first surface;

a first aberration measurement unit disposed on a first region of the first surface;

a second aberration measurement unit disposed on a second region of the first surface, the second region away from the first region;

a pellicle provided as a second transparent substrate having a second surface, the pellicle disposed opposite to the first surface; and a first polarizer disposed on the second surface so as to be opposite to the first aberration measurement unit.

11. The photomask of claim 10, further comprising:

a second polarizer disposed on the second surface so as to be opposite to the second aberration measurement unit.

12. The photomask of claim 11, wherein the first polarizer polarizes an exposure light to a first polarization state; and the second polarizer polarizes the exposure light to a second polarization state different from the first polarization state.

13. The photomask of claim 12, wherein each of the first and second polarizers is provided by a line and space pattern.

14. The photomask of claim 10, wherein each of the first and second aberration measurement units has a plurality of aberration measurement marks which include a line and space pattern having a period so as to satisfy one of a three-beam interference condition and a two-beam interference condition.

15. The photomask of claim 12, wherein the first polarization state is a linearly polarized state.

16. The photomask of claim 12, wherein a polarization plane of the second polarization state is orthogonal to a polarization plane of the first polarization state.

17. The photomask of claim 13, wherein a period of the line and space patterns of each of the first and second polarizers is equal to or less than a wavelength of an exposure light.

18. The photomask of claim 10, wherein the first aberration measurement unit is configured to measure a first optical characteristic of a projection optical system by transferring an image of the first aberration measurement unit on a wafer through the projection optical system by use of an exposure light, and the second aberration measurement unit configured to measure a second optical characteristic of the projection optical system by transferring an image of the second aberration measurement unit on the wafer through the projection optical system by use of an exposure light.

* * * * *